United States Patent
Maeda et al.

(10) Patent No.: US 6,338,931 B1
(45) Date of Patent: Jan. 15, 2002

(54) RESIST COMPOSITIONS AND PATTERNING PROCESS

(75) Inventors: Kazunori Maeda; Takeshi Nagata; Satoshi Watanabe; Youichi Ohsawa; Jun Watanabe; Shigehiro Nagura, all of Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/637,595

(22) Filed: Aug. 15, 2000

(30) Foreign Application Priority Data

Aug. 16, 1999 (JP) ............................................ 11-230143

(51) Int. Cl.$^7$ ................................................ G03F 7/039
(52) U.S. Cl. .................... 430/170; 430/270.1; 430/326; 430/905
(58) Field of Search ............................... 430/170, 270.1, 430/905, 326

(56) References Cited

U.S. PATENT DOCUMENTS

| | | | |
|---|---|---|---|
| 5,389,491 A | * 2/1995 | Tani et al. .................... | 430/170 |
| 5,424,166 A | * 6/1995 | Pawlowski et al. .......... | 430/157 |
| 5,468,589 A | * 11/1995 | Urano et al. .................. | 430/170 |
| 5,492,793 A | 2/1996 | Breyta et al. | |
| 5,558,971 A | 9/1996 | Urano et al. | |
| 5,558,976 A | 9/1996 | Urano et al. | |
| 5,625,020 A | 4/1997 | Breyta et al. | |
| 5,770,343 A | * 6/1998 | Sato et al. ................... | 430/170 |
| 5,908,730 A | * 6/1999 | Nitta et al. .................. | 430/170 |
| 5,945,248 A | * 8/1999 | Nitta et al. .................. | 430/170 |
| 6,090,518 A | * 7/2000 | Niinomi et al. ............. | 430/170 |
| 6,143,460 A | * 11/2000 | Kobayashi et al. .......... | 430/170 |

OTHER PUBLICATIONS

English Abstract for JP–8–123032.
English Abstract for JP–11–72921.
English Abstract for JP–11–38604.
English Abstract for JP–6–148889.
English Abstract for JP–6–266112.
English Abstract for JP–4–211258.

Leo A. Paquette, "Alpha–Halosulfones. IV. A Facile Conversion of Mercaptans to Homologous Terminal Olefins," *J. Am. Chem. Soc.*, vol. 86, pp. 4383–4385 (1964).

L.A. Walter et al., "Thioether Barbiturates. I. Thiomethyl Derivatives," *J. Am. Chem. Soc.*, vol. 67, pp. 655–657 (1945).

\* cited by examiner

*Primary Examiner*—John S. Chu
(74) *Attorney, Agent, or Firm*—Millen, White, Zelano & Branigan, P.C.

(57) ABSTRACT

A chemical amplification type resist composition contains as a photoacid generator a sulfonyldiazomethane compound of the formula (1):

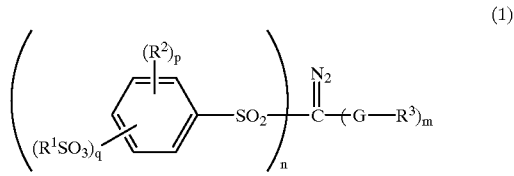

wherein $R^1$ is $C_{1-10}$ alkyl or $C_{6-14}$ aryl, $R^2$ is $C_{1-6}$ alkyl, G is $SO_2$ or CO, $R^3$ is $C_{1-10}$ alkyl or $C_{6-14}$ aryl, p is an integer of 0 to 4, q is an integer of 1 to 5, $1 \leq p+q \leq 5$, n is 1 or 2, m is 0 or 1, and n+m=2. The composition is suited for microfabrication, especially by deep UV lithography because of many advantages including improved resolution, minimized line width variation or shape degradation even on long-term PED, minimized debris after coating, development and peeling, and improved pattern profile after development.

14 Claims, No Drawings

RESIST COMPOSITIONS AND PATTERNING PROCESS

This invention relates to resist compositions, especially chemical amplification type resist compositions which are sensitive to such radiation as UV, deep UV, electron beams, x-rays, excimer laser beams, γ-rays, and synchrotron radiation and suitable for the microfabrication of integrated circuits, and a patterning process using the same.

BACKGROUND OF THE INVENTION

While a number of efforts are currently being made to achieve a finer pattern rule in the drive for higher integration and operating speeds in LSI devices, deep-ultraviolet lithography is thought to hold particular promise as the next generation in microfabrication technology.

One technology that has attracted a good deal of attention recently utilizes as the deep UV light source a high-intensity KrF excimer laser, especially an ArF excimer laser featuring a shorter wavelength. There is a desire to have a microfabrication technique of finer definition by combining exposure light of shorter wavelength with a resist material having a higher resolution.

In this regard, the recently developed, acid-catalyzed, chemical amplification type resist materials are expected to comply with the deep UV lithography because of their many advantages including high sensitivity, resolution and dry etching resistance. The chemical amplification type resist materials include positive working materials that leave the unexposed areas with the exposed areas removed and negative working materials that leave the exposed areas with the unexposed areas removed.

In chemical amplification type, positive working, resist compositions to be developed with alkaline developers, an alkali-soluble phenol or a resin and/or compound in which carboxylic acid is partially or entirely protected with acid-labile protective groups (acid labile groups) is catalytically decomposed by an acid which is generated upon exposure, to thereby generate the phenol or carboxylic acid in the exposed area which is removed by an alkaline developer. Also, in similar negative working resist compositions, an alkali-soluble phenol or a resin and/or compound having carboxylic acid and a compound (acid crosslinking agent) capable of bonding or crosslinking the resin or compound under the action of an acid are crosslinked with an acid which is generated upon exposure whereby the exposed area is converted to be insoluble in an alkaline developer and the unexposed area is removed by the alkaline developer.

On use of the chemical amplification type, positive working, resist compositions, a resist film is formed by dissolving a resin having acid labile groups as a binder and a compound capable of generating an acid upon exposure to radiation (to be referred to as photoacid generator) in a solvent, applying the resist solution onto a substrate by a variety of methods, and evaporating off the solvent optionally by heating. The resist film is then exposed to radiation, for example, deep UV through a mask of a predetermined pattern. This is optionally followed by post-exposure baking (PEB) for promoting acid-catalyzed reaction. The exposed resist film is developed with an aqueous alkaline developer for removing the exposed area of the resist film, obtaining a positive pattern profile. The substrate is then etched by any desired technique. Finally the remaining resist film is removed by dissolution in a remover solution or ashing, leaving the substrate having the desired pattern profile.

The chemical amplification type, positive working, resist compositions adapted for KrF excimer lasers generally use a phenolic resin, for example, polyhydroxystyrene in which some or all of the hydrogen atoms of phenolic hydroxyl groups are protected with acid labile protective groups. An iodonium salt, sulfonium salt or bissulfonyldiazomethane compound is typically used as the photoacid generator. If necessary, there are added additives, for example, a dissolution inhibiting or promoting compound in the form of a carboxylic acid and/or phenol derivative having a molecular weight of up to 3,000 in which some or all of the hydrogen atoms of carboxylic acid and/or phenolic hydroxyl groups are protected with acid labile groups, a carboxylic acid compound for improving dissolution characteristics, a basic compound for improving contrast, and a surfactant for improving coating characteristics.

Bissulfonyldiazomethane compounds as shown below are advantageously used as the photoacid generator in chemical amplification type resist compositions, especially chemical amplification type, positive working, resist compositions adapted for KrF excimer lasers because they provide a high sensitivity and resolution and are free from poor compatibility with resins or poor solubility in resist solvents as found with the sulfonium and iodonium salt photoacid generators.

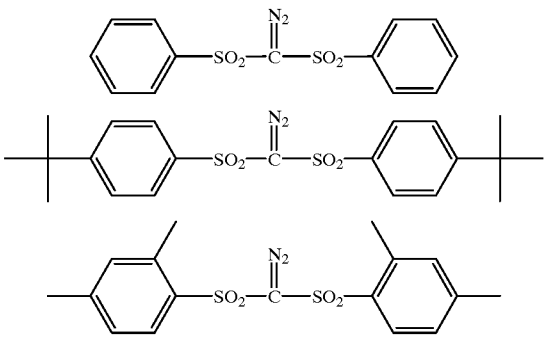

Although these photoacid generators are highly lipophilic and highly soluble in resist solvents, they have poor affinity to or solubility in developers so that upon development and/or resist removal, the photoacid generators can be left on the substrate as insoluble matter (consisting of the photoacid generator or a mixture thereof with the resin).

For example, upon development, the resist material which has poor affinity to or solubility in a developer deposits on developed spaces in the exposed area or on lines in the unexposed area as foreign matter.

If unsubstituted bis(phenylsulfonyl)diazomethane or bis(cyclohexylsulfonyl)diazomethane having alkyl groups instead of aryl groups is used in a resist material as the photoacid generator having reduced lipophilic property, resolution is deteriorated and the problem of insoluble matter upon development and/or resist film removal remains unsolved. A prolonged period from exposure to post-exposure baking (PEB), which is known as post-exposure delay (PED), often invites a change of the pattern profile, and a narrowing of the line width in the unexposed area in the case of chemical amplification type, positive working, resist compositions having acid labile groups, typically acetal groups. Since the period from exposure to PEB is often prolonged for some process reason or other, there is a desire to have a resist material which remains stable or unchanged, that is, has good PED stability.

Aside from the countermeasure for foreign matter, JP-A 10-90884 discloses to introduce such an acid labile group as t-butoxycarbonyloxy, ethoxyethyl or tetrahydropyranyl into disulfonediazomethane for the purpose of improving the contrast of positive resist material. We empirically found that these compounds are unstable and ineffective for eliminating the foreign matter upon development and resist film removal.

It is known from JP-A 8-123032 to use two or more photoacid generators in a resist material. JP-A 11-72921 discloses the use of a radiation-sensitive photoacid generator comprising in admixture a compound which generates a sulfonic acid having at least three fluorine atoms upon exposure to radiation and a compound which generates a fluorine atom-free sulfonic acid upon exposure to radiation, thereby improving resolution without inviting nano-edge roughness and film surface roughening. JP-A 11-38604 discloses a resist composition comprising a polyhydroxystyrene derivative having acid labile groups as the base resin and an asymmetric bissulfonyldiazomethane such as a bis-sulfonyldiazomethane having alkylsulfonyl and arylsulfonyl groups or a bissulfonyldiazomethane having arylsulfonyl and alkoxy-substituted arylsulfonyl groups, which composition allegedly has at least a comparable resolving power to the prior art resist materials as well as a satisfactory sensitivity and heat resistance. However, we empirically found that these resist compositions are unsatisfactory in resolution and in the effect of eliminating the foreign matter upon development, and the asymmetric bissulfonyldiazomethane compounds are difficult to synthesize in an industrial manner.

For the purpose of improving the resolution upon microfabrication, JP-A 6-148889 discloses a positive photosensitive composition comprising a polyfunctional enol ether compound and an alkali-soluble resin as typified by polyhydroxystyrene, which are thermally crosslinked on a substrate, followed by exposure to radiation and PEB to provide a desired pattern. JP-A 6-266112 discloses a photosensitive resist composition comprising a photosensitive acid generator and a polymer composed of hydroxystyrene and an acrylate and/or methacrylate. These compositions, however, are unsatisfactory in resolution and pattern profile. When the existing bissulfonyldiazomethane compounds are used therein, there is left the problem of foreign matter upon development and resist film removal.

The solubility of photosensitive agents or photoacid generators was the problem from the age when quinonediazide photosensitive agents were used in non-chemical amplification type resist materials. Specific considerations include the solubility of photoacid generators in resist solvents, the compatibility of photoacid generators with resins, the solubility (or affinity) of photo-decomposed products after exposure and PEB and non-decomposed compound (photoacid generator) in a developer, and the solubility of the photoacid generator and photo-decomposed products thereof in a remover solvent upon resist removal or peeling. If these factors are poor, there can occur problems including precipitation of the photoacid generator during storage, difficulty of filtration, uneven coating, striation, abnormal resist sensitivity, and foreign matter, left-over and staining on the pattern and in spaces after development.

The photoacid generator in resist material is required to meet a fully high solubility in (or compatibility with) a resist solvent and a resin, good storage stability, non-toxicity, effective coating, a well-defined pattern profile, PED stability, and no foreign matter left during pattern formation after development and upon resist removal. The conventional photoacid generators, especially diazodisulfone photoacid generators do not meet all of these requirements.

As the pattern of integrated circuits becomes finer in these days, a higher resolution is, of course, required, and the problem of foreign matter after development and resist removal becomes more serious.

SUMMARY OF THE INVENTION

An object of the invention is to provide a resist composition, especially of the chemical amplification type, inter alia, chemical amplification positive type, which minimizes the foreign matter left after coating, development and resist removal and ensures a well-defined pattern profile after development. Another object of the invention is to provide a patterning process using the same.

We have found that by using a sulfonyldiazomethane compound of the general formula (1), especially formula (1a), to be defined below, as the photoacid generator in a resist composition, there are achieved a number of advantages including dissolution, storage stability, effective coating, minimized line width variation or shape degradation during long-term PED, minimized foreign matter left after coating, development and resist removal, a well-defined pattern profile after development, and a high resolution enough for microfabrication, especially by deep UV lithography. Better results are obtained when a sulfonyldiazomethane compound of the formula (1), especially formula (1a), is used as the photoacid generator in a chemical amplification type resist composition, typically chemical amplification positive type resist composition comprising a resin which changes its solubility in an alkaline developer under the action of an acid as a result of scission of C—O—C linkages. The composition exerts its effect to the maximum extent when processed by deep UV lithography.

In a first aspect, the invention provides a resist composition comprising as a photoacid generator a sulfonyldiazomethane compound of the following general formula (1).

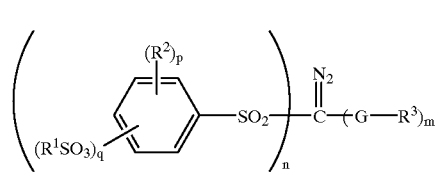

(1)

Herein $R^1$ is a substituted or unsubstituted, straight, branched or cyclic alkyl group of 1 to 10 carbon atoms or substituted or unsubstituted aryl group of 6 to 14 carbon atoms, $R^2$ which may be the same or different is a straight, branched or cyclic alkyl group of 1 to 6 carbon atoms, G is $SO_2$ or CO, $R^3$ is a substituted or unsubstituted, straight, branched or cyclic alkyl group of 1 to 10 carbon atoms or substituted or unsubstituted aryl group of 6 to 14 carbon atoms, p is an integer of 0 to 4, q is an integer of 1 to 5, p+q is from 1 to 5, n is equal to 1 or 2, m is equal to 0 or 1, and n+m is equal to 2.

In one embodiment, the sulfonyldiazomethane compound is a bissulfonyldiazomethane compound of the following general formula (1a).

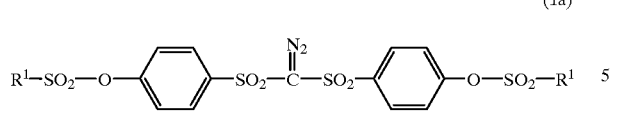
(1a)

Herein $R^1$ is a substituted or unsubstituted, straight, branched or cyclic alkyl group of 1 to 10 carbon atoms or substituted or unsubstituted aryl group of 6 to 14 carbon atoms.

In a second aspect, the invention provides a chemical amplification type resist composition comprising (A) a resin which changes its solubility in an alkaline developer under the action of an acid, and (B) a sulfonyldiazomethane compound capable of generating an acid upon exposure to radiation represented by the general formula (1) or (1a) defined above. The resist composition may further contain (C) a compound capable of generating an acid upon exposure to radiation other than component (B).

Preferably, the resin (A) has such substituent groups having C—O—C linkages that the solubility in an alkaline developer changes as a result of scission of the C—O—C linkages under the action of an acid.

Also preferably, the resin (A) is a polymer containing phenolic hydroxyl groups in which hydrogen atoms of the phenolic hydroxyl groups are replaced by acid labile groups of at least one type in a proportion of more than 0 mol % to 80 mol %, on the average, of the entire hydrogen atoms of the phenolic hydroxyl groups, the polymer having a weight average molecular weight of 3,000 to 100,000.

More preferably, the resin (A) is a polymer comprising recurring units represented by the following general formula (2).

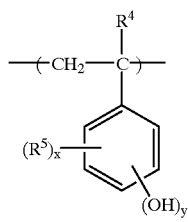
(2)

Herein $R^4$ is hydrogen or methyl, $R^5$ is a straight, branched or cyclic alkyl group of 1 to 8 carbon atoms, x is 0 or a positive integer, y is a positive integer, and x+y is up to 5, in which hydrogen atoms of the phenolic hydroxyl groups are replaced by acid labile groups of at least one type in a proportion of more than 0 mol % to 80 mol %, on the average, of the entire hydrogen atoms of the phenolic hydroxyl groups, the polymer having a weight average molecular weight of 3,000 to 100,000.

Further preferably, the resin (A) is the polymer of formula (2) in which some of the hydrogen atoms of the phenolic hydroxyl groups are replaced by acid labile groups of at least one type, and the hydrogen atoms of the remaining phenolic hydroxyl groups are crosslinked within a molecule and/or between molecules, in a proportion of more than 0 mol % to 50 mol %, on the average, of the entire phenolic hydroxyl groups on the polymer, with crosslinking groups having C—O—C linkages represented by the following general formula (3a) or (3b).

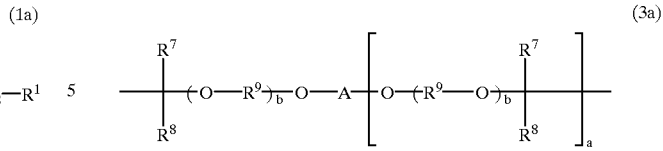
(3a)

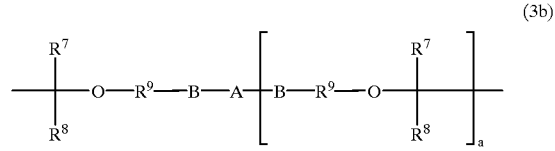
(3b)

Herein each of $R^7$ and $R^8$ is hydrogen or a straight, branched or cyclic alkyl group of 1 to 8 carbon atoms, or $R^7$ and $R^8$, taken together, may form a ring, and each of $R^7$ and $R^8$ is a straight or branched alkylene group of 1 to 8 carbon atoms when they form a ring, $R^9$ is a straight, branched or cyclic alkylene group of 1 to 10 carbon atoms, letter a is an integer of 1 to 7, letter b is 0 or an integer of 1 to 10, A is an (a+1)-valent aliphatic or alicyclic saturated hydrocarbon group, aromatic hydrocarbon group or heterocyclic group of 1 to 50 carbon atoms, which may be separated by a hetero atom and in which some of the hydrogen atoms attached to carbon atoms may be replaced by hydroxyl, carboxyl, carbonyl or halogen, B is —CO—O—, —NHCO—O— or —NHCONH—.

Also preferably, the resin (A) is a polymer comprising recurring units represented by the following general formula (2a').

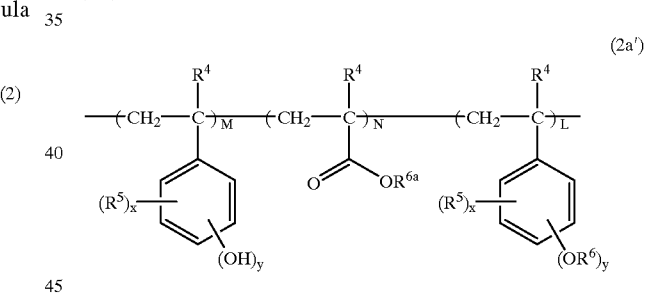
(2a')

Herein $R^4$ is hydrogen or methyl, $R^5$ is a straight, branched or cyclic alkyl group of 1 to 8 carbon atoms, $R^6$ is an acid labile group, $R^{6a}$ is hydrogen or an acid labile group, $R^{6a}$ being at least partially an acid labile group, x is 0 or a positive integer, y is a positive integer, satisfying x+y≦5, M and N are positive integers, L is 0 or a positive integer, satisfying 0<N/(M+N)≦0.5 and 0<(N+L)/(M+N+L) ≦0.8. In the copolymer comprising units of p-hydroxystyrene and/or α-methyl-p-hydroxystyrene, units thereof in which some hydrogen atoms of phenolic hydroxyl groups are replaced by acid labile groups of at least one type, and units of acrylate and/or methacrylate, the acrylate and/or methacrylate is an ester protected with an acid labile group, the units of acrylate and methacrylate are contained in the polymer in a proportion of more than 0 mol % to 50 mol % on the average, the acid labile groups are present in a proportion of more than 0 mol % to 80 mol %, on the average, based on the entire polymer, and the polymer has a weight average molecular weight of 3,000 to 100,000.

Typically the acid labile groups are groups of the following general formulae (4) to (7), tertiary alkyl groups of 4 to 20 carbon atoms, trialkylsilyl groups whose alkyl groups each have 1 to 6 carbon atoms, oxoalkyl groups of 4 to 20 carbon atoms, or aryl-substituted alkyl groups of 7 to 20 carbon atoms.

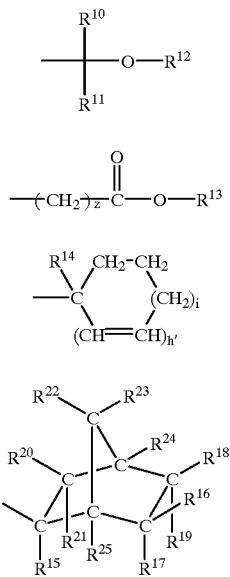

Herein $R^{10}$ and $R^{11}$ are independently hydrogen or straight, branched or cyclic alkyl groups of 1 to 18 carbon atoms, $R^{12}$ is a monovalent hydrocarbon group of 1 to 18 carbon atoms which may have a hetero atom, or $R^{10}$ and $R^{11}$, $R^{10}$ and $R^{12}$, or $R^{11}$ and $R^{12}$, taken together, may form a ring, with the proviso that each of $R^{10}$, $R^{11}$ and $R^{12}$ is a straight or branched alkylene group of 1 to 18 carbon atoms when they form a ring, $R^{13}$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (4), and letter z is an integer of 0 to 6, $R^{14}$ is a straight, branched or cyclic alkyl group of 1 to 8 carbon atoms or substituted or unsubstituted aryl group of 6 to 20 carbon atoms, h' is equal to 0 or 1, i is equal to 0, 1, 2 or 3, satisfying 2h'+i=2 or 3, $R^{15}$ is a straight, branched or cyclic alkyl group of 1 to 8 carbon atoms or substituted or unsubstituted aryl group of 6 to 20 carbon atoms, $R^{16}$ to $R^{25}$ are independently hydrogen or monovalent hydrocarbon groups of 1 to 15 carbon atoms which may contain a hetero atom, or $R^{16}$ to $R^{25}$, taken together, may form a ring, with the proviso that they are divalent hydrocarbon groups of 1 to 15 carbon atoms which may contain a hetero atom when they form a ring, or two of $R^{16}$ to $R^{25}$ which are attached to adjacent carbon atoms may directly bond together to form a double bond.

The resist composition may further contain (D) a basic compound; (E) an organic acid derivative; and a propylene glycol alkyl ether acetate, an alkyl lactate or a mixture thereof as a solvent.

Also contemplated herein is a process for forming a pattern, comprising the steps of applying the above-defined resist composition onto a substrate to form a coating; heat treating the coating and exposing the coating to high energy radiation with a wavelength of up to 300 nm or electron beam through a photo-mask; optionally heat treating the exposed coating, and developing the coating with a developer.

DESCRIPTION OF THE PREFERRED EMBODIMENT

The resist composition of the invention contains a novel sulfonyldiazomethane compound of the following general formula (1) as a photoacid generator.

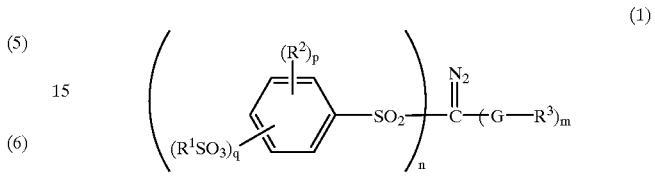

Herein $R^1$ is a substituted or unsubstituted, straight, branched or cyclic alkyl group of 1 to 10 carbon atoms or substituted or unsubstituted aryl group of 6 to 14 carbon atoms, $R^2$ which may be the same or different is a straight, branched or cyclic alkyl group of 1 to 6 carbon atoms, G is $SO_2$ or CO, $R^3$ is a substituted or unsubstituted, straight, branched or cyclic alkyl group of 1 to 10 carbon atoms or substituted or unsubstituted aryl group of 6 to 14 carbon atoms, p is an integer of 0 to 4, q is an integer of 1 to 5, satisfying $1 \leq p+q \leq 5$, n is equal to 1 or 2, m is equal to 0 or 1, and n+m=2.

Preferred among the sulfonyldiazomethane compounds of formula (1) are bissulfonyldiazomethane compounds having sulfonyloxyphenyl groups of the following general formula (1a):

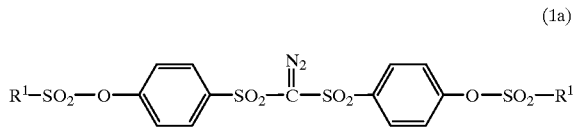

wherein $R^1$ is a substituted or unsubstituted, straight, branched or cyclic alkyl group of 1 to 10 carbon atoms or substituted or unsubstituted aryl group of 6 to 14 carbon atoms.

In formula (1) or (1a), $R^1$ stands for substituted or unsubstituted, straight, branched or cyclic alkyl groups of 1 to 10 carbon atoms or substituted or unsubstituted aryl groups of 6 to 14 carbon atoms. Illustrative, non-limiting, examples of the substituted or unsubstituted, straight, branched or cyclic alkyl groups of 1 to 10 carbon atoms include methyl, ethyl, n-propyl, sec-propyl, n-butyl, sec-butyl, iso-butyl, tert-butyl, n-pentyl, sec-pentyl, cyclopentyl, n-hexyl, cyclohexyl, and groups represented by the following formulae.

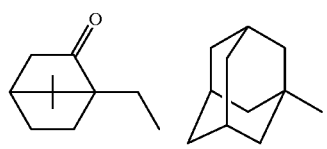

Illustrative, non-limiting, examples of the substituted or unsubstituted aryl groups of 6 to 14 carbon atoms include phenyl, 4-methylphenyl, 4-ethylphenyl, 4-methoxyphenyl, 4-tert-butylphenyl, 2,4-dimethylphenyl, 2,4,6-trimethylphenyl, 2,4,6-triisopropylphenyl, 1-naphthyl and 2-naphthyl.

In formula (1), $R^2$ stands for straight, branched or cyclic alkyl groups of 1 to 6 carbon atoms, and the $R^2$ groups may be the same or different. Illustrative, non-limiting, examples of the straight, branched or cyclic alkyl groups include methyl, ethyl, n-propyl, sec-propyl, n-butyl, sec-butyl, iso-butyl, tert-butyl, n-pentyl, sec-pentyl, cyclopentyl, n-hexyl, and cyclohexyl. G stands for $SO_2$ or CO. $R^3$ stands for substituted or unsubstituted, straight, branched or cyclic alkyl groups of 1 to 10 carbon atoms or substituted or unsubstituted aryl groups of 6 to 14 carbon atoms. Exemplary of $R^3$ are straight, branched or cyclic alkyl groups such as methyl, ethyl, n-propyl, sec-propyl, n-butyl, sec-butyl, iso-butyl, tert-butyl, n-pentyl, sec-pentyl, cyclopentyl, n-hexyl, and cyclohexyl, and aryl groups such as phenyl, 4-methylphenyl, 4-ethylphenyl, 4-methoxyphenyl, 4-tert-butylphenyl, 4-tert-butoxyphenyl, 4-cyclohexylphenyl, 4-cyclohexyloxyphenyl, 2,4-dimethylphenyl, 2,4,6-trimethylphenyl, 2,4,6-triisopropylphenyl, 1-naphthyl and 2-naphthyl though not limited thereto. Letter p is an integer of 0 to 4, q is an integer of 1 to 5, satisfying $1 \leq p+q \leq 5$. Letter n is equal to 1 or 2, m is equal to 0 or 1, and n+m=2.

The sulfonyldiazomethane compounds can be synthesized by the following method although the synthesis method is not limited thereto.

Reference is first made to a sulfonyldiazomethane compound of formula (1) wherein n=2, that is, a symmetric bissulfonyldiazomethane compound. It is desirably synthesized by condensing a substituted thiophenol with dichloromethane under basic conditions as disclosed in JP-A 3-103854. More preferably, a hydroxyl-containing thiophenol such as p-hydroxythiophenol is condensed with dichloromethane in an alcohol solvent such as methanol or ethanol in the presence of a base such as sodium hydroxide or potassium hydroxide, obtaining formaldehyde (hydroxyphenylthio)acetal.

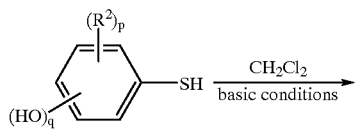

Herein, p, q and $R^2$ are as defined above.

Alternatively, a substituted thiophenol is condensed with formaldehyde (p-formaldehyde) under acidic conditions such as sulfuric acid or trifluoromethanesulfonic acid.

In the case of n=1, that is, an asymmetric sulfonyl diazomethane compound, reaction is effected between a halomethylthio ether and hydroxythiophenol or between an α-halomethylketone and hydroxythiophenol. The halomethylthio ether can be prepared from a corresponding thiol, formaldehyde and hydrogen chloride (see J. Am. Chem. Soc., 86, 4383 (1964), J. Am. Chem. Soc., 67, 655 (1945), and U.S. Pat. No. 2,354,229).

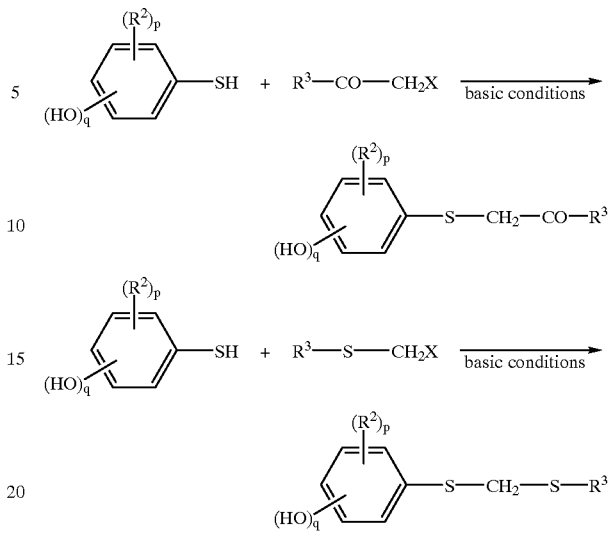

Herein, p, q, $R^2$ and $R^3$ are as defined above, and X is a halogen atom.

The product is then reacted with a corresponding sulfonyl halide or sulfonic anhydride represented by $R^1SO_2X$ or $(R^1SO_2)_2O$ wherein X is a halogen atom.

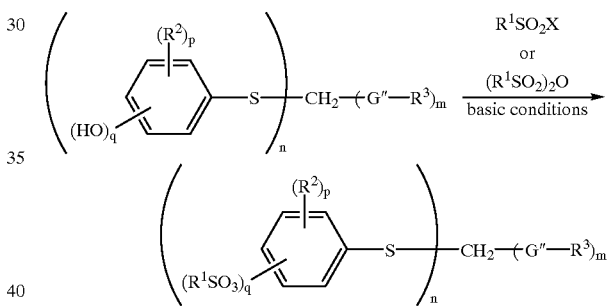

Herein, p, q, n, m, $R^1$, $R^2$, $R^3$ and X are as defined above, and G" is S or CO.

Further, the product is oxidized with an oxidant such as aqueous hydrogen peroxide in the presence of sodium tungstate etc. as described in JP-A 4-211258, yielding a corresponding sulfonylmethane.

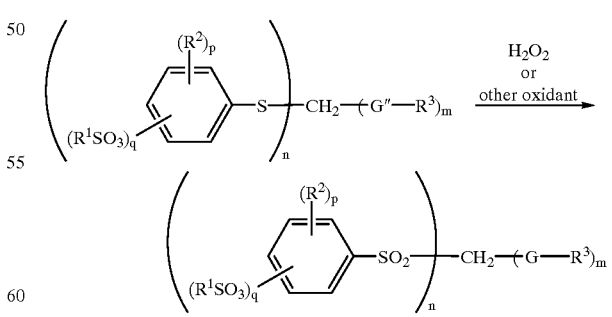

Herein, p, q, n, m, $R^1$, $R^2$, $R^3$, X, G" and G are as defined above.

This product is reacted with p-toluenesulfonylazide or p-dodecylbenzenesulfonylazide under basic conditions into a diazo form, yielding the end bissulfonyldiazomethane.

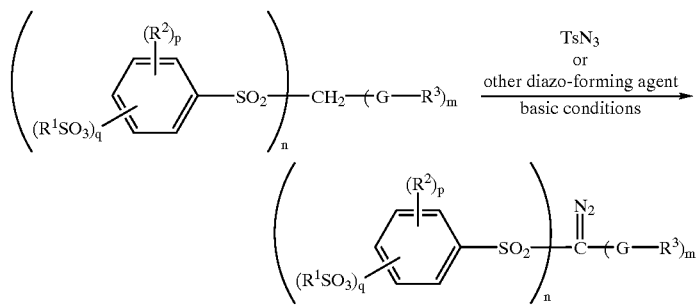

Herein, p, q, n, m, $R^1$, $R^2$, $R^3$ and G are as defined above.

Instead of the above-described step of reacting the formaldehyde (hydroxyphenylthio)acetal with a corresponding sulfonylhalide or sulfonic anhydride to introduce a sulfonic ester, it is acceptable to oxidize the formaldehyde (hydroxyphenylthio)acetal with an oxidant such as aqueous hydrogen peroxide to form (hydroxyphenylsulfonyl)methane. The product is reacted with a corresponding sulfonyl halide or sulfonic anhydride represented by $R^1SO_2X$ or $(R^1SO_2)_2O$ wherein X is a halogen atom to synthesize (sulfonyloxyphenylsulfonyl)methane, which is then converted into a diazo form by the above-described method. This reaction scheme is shown below.

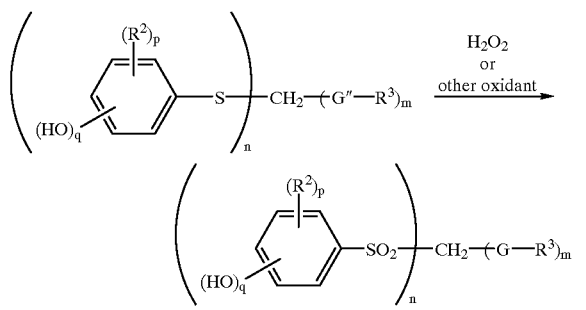

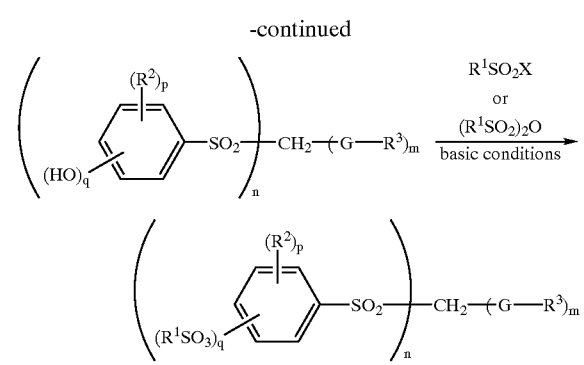

Herein, p, q, n, m, $R^1$, $R^2$, $R^3$, X, G″ and G are as defined above.

It is still acceptable to convert bis(hydroxyphenyl sulfonyl)methane into a diazo form, and react the diazo with a corresponding sulfonyl halide or sulfonic anhydride for introducing a sulfonate. This reaction scheme is shown below.

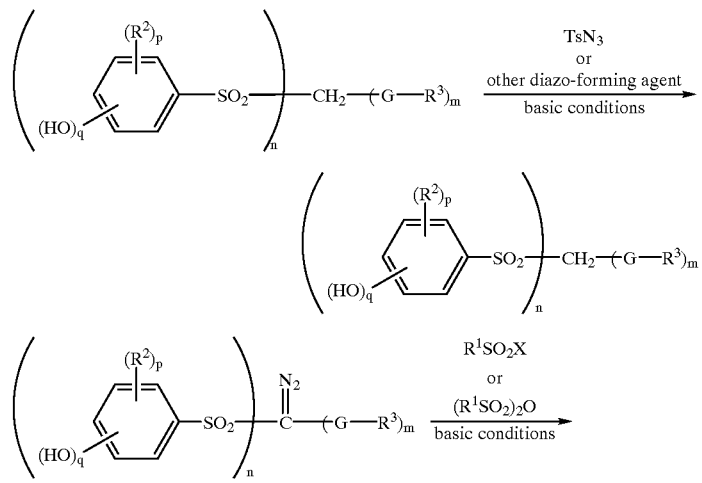

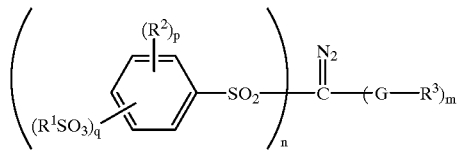

Herein, p, q, n, m, $R^1$, $R^2$, $R^3$, X, and G are as defined above.

However, the above-described procedures often encounter difficulty in isolating and purifying the end product and in converting a sulfonylmethane having a phenolic hydroxyl group into a diazo form because (hydroxyphenylsulfonyl)methane is highly soluble in water.

Illustrative, non-limiting, examples of the sulfonyldiazomethane compounds of formulae (1) and (1a) include bis (4-methanesulfonyloxyphenylsulfonyl)diazomethane,
bis(4-ethanesulfonyloxyphenylsulfonyl)diazomethane,
bis(4-(n-propanesulfonyloxy)phenylsulfonyl)diazomethane,
bis(4-(n-butanesulfonyloxy)phenylsulfonyl)diazomethane,
bis(4-cyclohexylsulfonyloxyphenylsulfonyl)diazomethane,
bis(4-benzenesulfonyloxyphenylsulfonyl)diazomethane,
bis(4-(4'-toluenesulfonyloxy)phenylsulfonyl)diazomethane,
(4-methanesulfonyloxyphenylsulfonyl)(methylsulfonyl)diazomethane,
(4-methanesulfonyloxyphenylsulfonyl)(tert-butylsulfonyl)diazomethane,
(4-methanesulfonyloxyphenylsulfonyl)(cyclohexylsulfonyl)diazomethane,
(4-methanesulfonyloxyphenylsulfonyl)(benzenesulfonyl)diazomethane,
(4-methanesulfonyloxyphenylsulfonyl)(p-toluenesulfonyl)diazomethane,
(4-methanesulfonyloxyphenylsulfonyl)(2,4-dimethylphenylsulfonyl)diazomethane,
(4-methanesulfonyloxyphenylsulfonyl)(4-tert-butylphenylsulfonyl)diazomethane,
(4-methanesulfonyloxyphenylsulfonyl)(4-tert-butoxyphenylsulfonyl)diazomethane,
(4-ethanesulfonyloxyphenylsulfonyl)(methylsulfonyl)diazomethane,
(4-ethanesulfonyloxyphenylsulfonyl)(tert-butylsulfonyl)diazomethane,
(4-ethanesulfonyloxyphenylsulfonyl)(cyclohexylsulfonyl)diazomethane,
(4-ethanesulfonyloxyphenylsulfonyl)(benzenesulfonyl)diazomethane,
(4-ethanesulfonyloxyphenylsulfonyl)(p-toluenesulfonyl)diazomethane,
(4-ethanesulfonyloxyphenylsulfonyl)(2,4-dimethylphenylsulfonyl)diazomethane,
(4-ethanesulfonyloxyphenylsulfonyl)(4-tert-butylphenylsulfonyl)diazomethane,
(4-ethanesulfonyloxyphenylsulfonyl)(4-tert-butoxyphenylsulfonyl)diazomethane,
(4-n-butanesulfonyloxyphenylsulfonyl)(methylsulfonyl)diazomethane,
(4-n-butanesulfonyloxyphenylsulfonyl)(tert-butylsulfonyl)diazomethane,
(4-n-butanesulfonyloxyphenylsulfonyl)(cyclohexylsulfonyl)diazomethane,
(4-n-butanesulfonyloxyphenylsulfonyl)(benzenesulfonyl)diazomethane,
(4-n-butanesulfonyloxyphenylsulfonyl)(p-toluenesulfonyl)diazomethane,
(4-n-butanesulfonyloxyphenylsulfonyl)(2,4-dimethylphenylsulfonyl)diazomethane,
(4-n-butanesulfonyloxyphenylsulfonyl)(4-tert-butylphenylsulfonyl)diazomethane,
(4-n-butanesulfonyloxyphenylsulfonyl)(4-tert-butoxyphenylsulfonyl)diazomethane,
(4-methanesulfonyloxyphenylsulfonyl)(methylcarbonyl)diazomethane,
(4-methanesulfonyloxyphenylsulfonyl)(tert-butylcarbonyl)diazomethane,
(4-methanesulfonyloxyphenylsulfonyl)(cyclohexylcarbonyl)diazomethane,
(4-methanesulfonyloxyphenylsulfonyl)(benzoyl)diazomethane,
(4-methanesulfonyloxyphenylsulfonyl)(p-toluenecarbonyl)diazomethane,
(4-methanesulfonyloxyphenylsulfonyl)(2,4-dimethylphenylcarbonyl)diazomethane,
(4-methanesulfonyloxyphenylsulfonyl)(4-tert-butylphenylcarbonyl)diazomethane,
(4-methanesulfonyloxyphenylsulfonyl)(4-tert-butoxyphenylcarbonyl)diazomethane,
(4-ethanesulfonyloxyphenylsulfonyl)(methylcarbonyl)diazomethane,
(4-ethanesulfonyloxyphenylsulfonyl)(tert-butylcarbonyl)diazomethane,
(4-ethanesulfonyloxyphenylsulfonyl)(cyclohexylcarbonyl)diazomethane,
(4-ethanesulfonyloxyphenylsulfonyl)(benzoyl)diazomethane,
(4-ethanesulfonyloxyphenylsulfonyl)(p-toluenecarbonyl)diazomethane,
(4-ethanesulfonyloxyphenylsulfonyl)(2,4-dimethylphenylcarbonyl)diazomethane,
(4-ethanesulfonyloxyphenylsulfonyl)(4-tert-butylphenylcarbonyl)diazomethane,
(4-ethanesulfonyloxyphenylsulfonyl)(4-tert-butoxyphenylcarbonyl)diazomethane,
(4-n-butanesulfonyloxyphenylsulfonyl)(methylcarbonyl)diazomethane,
(4-n-butanesulfonyloxyphenylsulfonyl)(tert-butylcarbonyl)diazomethane,
(4-n-butanesulfonyloxyphenylsulfonyl)(cyclohexylcarbonyl)diazomethane,
(4-n-butanesulfonyloxyphenylsulfonyl)(benzoyl)diazomethane, (4-n-butanesulfonyloxyphenylsulfonyl)(p-toluenecarbonyl)diazomethane, (4-n-butanesulfonyloxyphenylsulfonyl)(2,4-dimethylphenylcarbonyl)diazomethane, (4-n-butanesulfonyloxyphenylsulfonyl)(4-tert-butylphenylcarbonyl)diazomethane, (4-n-butanesulfonyloxyphenylsulfonyl)(4-tert-butoxyphenylcarbonyl)diazomethane, etc.

The sulfonyldiazomethane compounds of formula (1) or (1a) are useful as the photoacid generator in resist materials sensitive to radiation such as ultraviolet, deep ultraviolet, electron beams, x-rays, excimer laser light, γ-rays, and synchrotron radiation for use in the microfabrication of integrated circuits, especially in chemical amplification type resist materials.

Resist Composition

The resist compositions of the invention contain one or more of the sulfonyldiazomethane compounds of formula (1) or (1a). The resist compositions may be either positive or negative working although they are preferably of the chemical amplification type.

The resist compositions of the invention include a variety of embodiments, 1) a chemically amplified positive working resist composition comprising (A) a resin which changes its solubility in an alkaline developer under the action of an acid, (B) a sulfonyldiazomethane compound capable of generating an acid upon exposure to radiation represented by the general formula (1) or (1a), and (F) an organic solvent;

2) a chemically amplified positive working resist composition of 1) further comprising (C) a photoacid generator capable of generating an acid upon exposure to radiation other than component (B);

3) a chemically amplified positive working resist composition of 1) or 2) further comprising (G) a compound with a molecular weight of up to 3,000 which changes its solubility in an alkaline developer under the action of an acid;

4) a chemically amplified positive working resist composition of 1) to 3) further comprising (D) a basic compound;

5) a chemically amplified positive working resist composition of 1) to 4) further comprising (E) an organic acid derivative;

6) a chemically amplified negative working resist composition comprising (B) a sulfonyldiazomethane compound capable of generating an acid upon exposure to radiation represented by the general formula (1) or (1a), (F) an organic solvent, (H) an alkali-soluble resin, and (I) an acid crosslinking agent capable of forming a crosslinked structure under the action of an acid;

7) a chemically amplified negative working resist composition of 6) further comprising (C) another photoacid generator; and 8) a chemically amplified negative working resist composition of 6) or 7) further comprising (D) a basic compound; but not limited thereto.

Now the respective components are described in detail.

Component (F)

Component (F) is an organic solvent. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Component (A)

Component (A) is a resin which changes its solubility in an alkaline developer solution under the action of an acid. It is typically, though not limited thereto, an alkali-soluble resin having phenolic hydroxyl and/or carboxyl groups in which some or all of the phenolic hydroxyl and/or carboxyl groups are protected with acid-labile protective groups having C—O—C.

The alkali-soluble resins having phenolic hydroxyl and/or carboxyl groups include homopolymers and copolymers of p-hydroxystyrene, m-hydroxystyrene, α-methyl-p-hydroxystyrene, 4-hydroxy-2-methylstyrene, 4-hydroxy-3-methylstyrene, methacrylic acid and acrylic acid, and such copolymers having a carboxylic derivative or diphenyl ethylene introduced at their terminus.

Also included are copolymers in which units free of alkali-soluble sites such as styrene, α-methylstyrene, acrylate, methacrylate, hydrogenated hydroxystyrene, maleic anhydride and maleimide are introduced in addition to the above-described units in such a proportion that the solubility in an alkaline developer may not be extremely reduced. Substituents on the acrylates and methacrylates may be any of the substituents which do not undergo acidolysis. Exemplary substituents are straight, branched or cyclic $C_{1-8}$ alkyl groups and aromatic groups such as aryl groups, but not limited thereto.

Examples of the alkali-soluble polymers are given below. These polymers may also be used as the material from which the resin (A) which changes its solubility in an alkaline developer under the action of an acid is prepared and as the alkali-soluble resin which serves as component (H) to be described later. Examples include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene-α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-acrylic acid copolymers, p-hydroxystyrene-methacrylic acid copolymers, p-hydroxystyrene-methyl methacrylate copolymers, p-hydroxystyrene-acrylic acid-methyl methacrylate copolymers, p-hydroxystyrene-methyl acrylate copolymers, p-hydroxystyrene-methacrylic acid-methyl methacrylate copolymers, poly(methacrylic acid), poly(acrylic acid), acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers, but are not limited to these combinations.

Preferred are poly(p-hydroxystyrene), partially hydrogenated p-hydroxystyrene copolymers, p-hydroxystyrene-styrene copolymers, p-hydroxystyrene-acrylic acid copolymers, and p-hydroxystyrene-methacrylic acid copolymers.

Alkali-soluble resins comprising units of the following formula (2) or (2') are especially preferred.

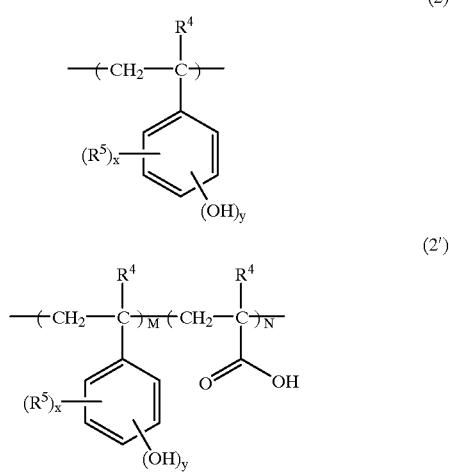

Herein $R^4$ is hydrogen or methyl, $R^5$ is a straight, branched or cyclic alkyl group of 1 to 8 carbon atoms, x is 0 or a positive integer, y is a positive integer, satisfying $x+y \leq 5$, and M and N are positive integers, satisfying $0 < N/(M+N) \leq 0.5$.

The polymer should preferably have a weight average molecular weight (Mw) of 3,000 to 100,000. Many polymers with Mw of less than 3,000 do not perform well and are poor in heat resistance and film formation. Many polymers with Mw of more than 100,000 give rise to a problem with respect to dissolution in the resist solvent and developer. The polymer should also preferably have a dispersity (Mw/Mn) of up to 3.5, and more preferably up to 1.5. With a dispersity of more than 3.5, resolution is low in many cases. Although the preparation method is not critical, a poly(p-hydroxystyrene) or similar polymer with a low dispersity or narrow dispersion can be synthesized by living anion polymerization.

In the resist composition using a sulfonyldiazomethane of formula (1), a resin having such substituent groups with C—O—C linkages (acid labile groups) that the solubility in an alkaline developer changes as a result of severing of the C—O—C linkages under the action of an acid, especially an alkali-soluble resin as mentioned above is preferably used as component (A). Especially preferred is a polymer comprising recurring units of the above formula (2) and containing phenolic hydroxyl groups in which hydrogen atoms of the phenolic hydroxyl group are replaced by acid labile groups of one or more types in a proportion of more than 0 mol % to 80 mol % on the average of the entire hydrogen atoms of the phenolic hydroxyl group, the polymer having a weight average molecular weight of 3,000 to 100,000.

Also preferred is a polymer comprising recurring units of the above formula (2'), that is, a copolymer comprising p-hydroxystyrene and/or α-methyl-p-hydroxystyrene and acrylic acid and/or methacrylic acid, wherein some of the hydrogen atoms of the phenolic hydroxyl groups are replaced by acid labile groups of one or more types, the copolymer comprising the acrylic acid and/or methacrylic acid which is partially an ester protected with an acid labile group, and the units based on the acrylic ester and/or methacrylic ester are contained in a proportion of more than 0 mol % to 50 mol %, on the average, of the copolymer, and wherein some of the hydrogen atoms of the phenolic hydroxyl groups of p-hydroxystyrene and/or α-methyl-p-hydroxystyrene may be replaced by acid labile groups of one or more types. Further preferred is such a copolymer in which the units based on the acrylic ester and/or methacrylic ester and the p-hydroxystyrene and/or α-methyl-p-hydroxystyrene having acid labile groups substituted thereon are contained in a proportion of more than 0 mol % to 80 mol %, on the average, of the copolymer.

Exemplary such polymers are polymers comprising recurring units represented by the following general formula (2a) or (2a') and having a weight average molecular weight of 3,000 to 100,000.

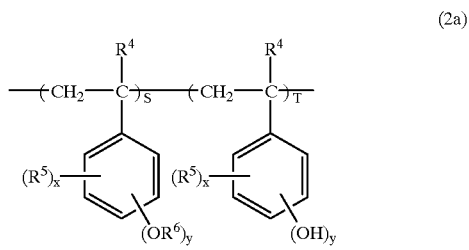

-continued (2a')

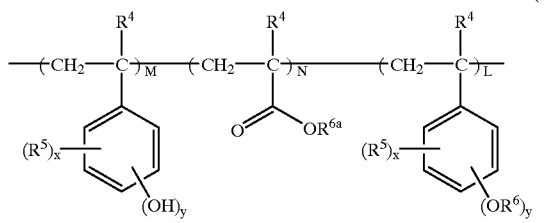

Herein, $R^4$ is hydrogen or methyl. $R^5$ is a straight, branched or cyclic alkyl group of 1 to 8 carbon atoms. $R^6$ is an acid labile group. $R^{6a}$ is hydrogen or an acid labile group, at least some, preferably all of the $R^{6a}$ groups are acid labile groups. Letter x is 0 or a positive integer, and y is a positive integer, satisfying $x+y\leq 5$. When y is 2 or more, the $R^6$ groups may be the same or different. S and T are positive integers, satisfying $0<S/(S+T)\leq 0.8$. M and N are positive integers, L is 0 or a positive integer, satisfying $0<N/(M+N)\leq 0.5$ and $0<(N+L)/(M+N+L)\leq 0.8$.

$R^5$ stands for straight, branched or cyclic $C_{1-8}$ alkyl groups, for example, methyl, ethyl, propyl, isopropyl, n-butyl, isobutyl, tert-butyl, cyclohexyl and cyclopentyl.

With respect to the acid labile groups, where some of the phenolic hydroxyl groups and some or all of the carboxyl groups in the alkali-soluble resin are protected with acid labile groups having C—O—C linkages, the acid labile groups are selected from a variety of such groups. The preferred acid labile groups are groups of the following general formulae (4) to (7), tertiary alkyl group of 4 to 20 carbon atoms, preferably 4 to 15 carbon atoms, trialkylsilyl groups whose alkyl groups each have 1 to 6 carbon atoms, oxoalkyl groups of 4 to 20 carbon atoms, or aryl-substituted alkyl groups of 7 to 20 carbon atoms.

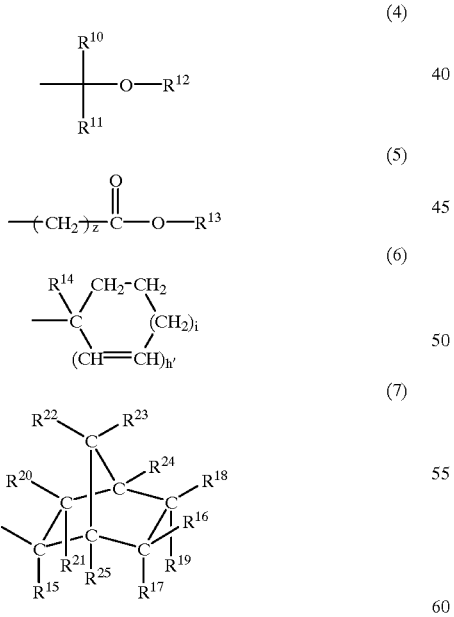

Herein $R^{10}$ and $R^{11}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{12}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

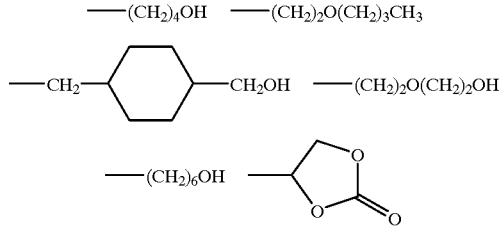

A pair of $R^{10}$ and $R^{11}$, a pair of $R^{10}$ and $R^{12}$, or a pair of $R^{11}$ and $R^{12}$, taken together, may form a ring. Each of $R^{10}$, $R^{11}$ and $R^{12}$ is a straight or branched alkylene group of 1 to 18 carbon atoms, preferably 1 to 10 carbon atoms, when they form a ring.

$R^{13}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-methylcyclopentyl, 1-ethylcyclopentyl, 1-isopropylcyclopentyl, 1-butylcyclopentyl, 1-methylcyclohexyl, 1-ethylcyclohexyl, 1-isopropylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxoran-5-yl. Letter z is an integer of 0 to 6.

$R^{14}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl. Exemplary substituted or unsubstituted aryl groups include phenyl, methylphenyl, naphthyl, anthryl, phenanthryl, and pyrenyl. Letter h' is equal to 0 or 1, i is equal to 0, 1, 2 or 3, satisfying 2h'+i=2 or 3.

$R^{15}$ is a straight, branched or cyclic alkyl group of 1 to 8 carbon atoms or substituted or unsubstituted aryl group of 6 to 20 carbon atoms, examples of which are as exemplified for $R^{14}$. $R^{16}$ to $R^{25}$ are independently hydrogen or monovalent hydrocarbon groups of 1 to 15 carbon atoms which may contain a hetero atom, for example, straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, and sulfo groups. $R^{16}$ to $R^{25}$, for example, a pair of $R^{16}$ and $R^{17}$, a pair of $R^{16}$ and $R^{18}$, a pair of $R^{17}$ and $R^{19}$, a pair of $R^{18}$ and $R^{19}$, a pair of $R^{20}$ and $R^{21}$, or a pair of $R^{22}$ and $R^{23}$, taken together, may form a ring. When $R^{16}$ to $R^{25}$ form a ring, they are divalent hydrocarbon groups which may contain a hetero atom, examples of which are the above-exemplified monovalent hydrocarbon groups with one hydrogen atom eliminated. Also, two of $R^{16}$ to $R^{25}$ which are attached to adjacent carbon atoms (for example, a pair of $R^{16}$ and $R^{18}$, a pair of $R^{18}$ and $R^{24}$, or a pair of $R^{22}$ and $R^{24}$) may directly bond together to form a double bond.

Of the acid labile groups of formula (4), illustrative examples of the straight or branched groups are given below.

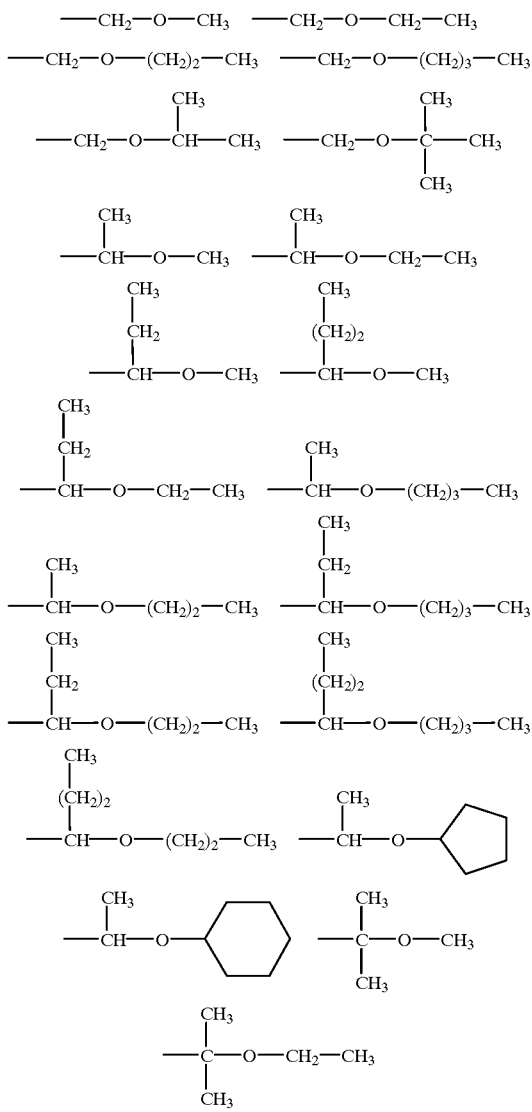

Of the acid labile groups of formula (4), illustrative examples of the cyclic groups include tetrahydrofuran-2-yl, 2-methyltetrahydrofuran-2-yl, tetrahydropyran-2-yl and 2-methyltetrahydropyran-2-yl.

Illustrative examples of the acid labile groups of formula (5) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile groups of formula (6) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Illustrative examples of the acid labile groups of formula (7) are given below.

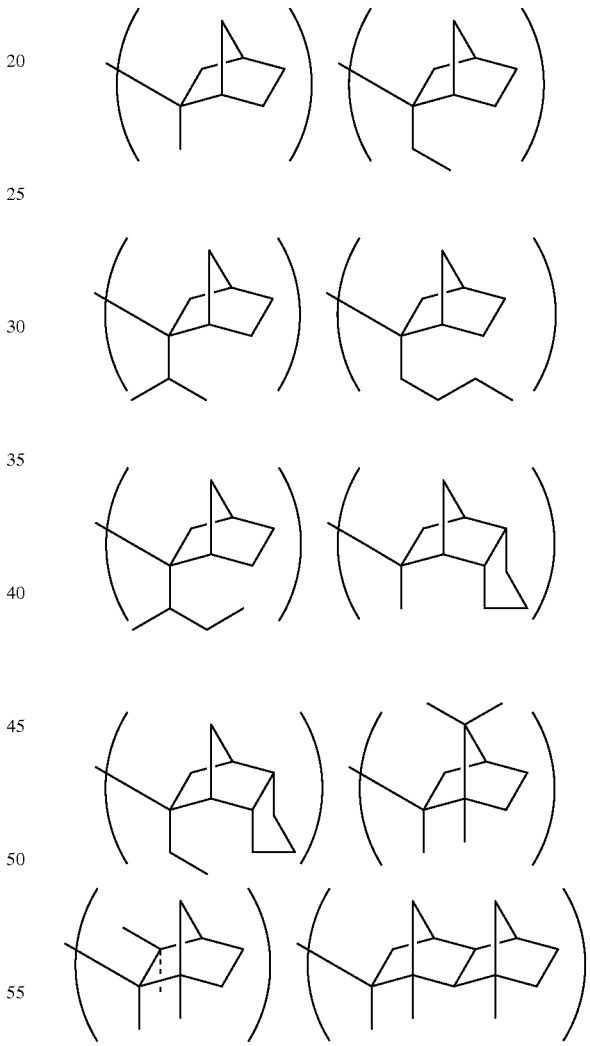

Exemplary of the tertiary alkyl group of 4 to 20 carbon atoms, preferably 4 to 15 carbon atoms, are tert-butyl, tert-amyl, 3-ethyl-3-pentyl and dimethylbenzyl.

Exemplary of the trialkylsilyl groups whose alkyl groups each have 1 to 6 carbon atoms are trimethylsilyl, triethylsilyl, and tert-butyldimethylsilyl.

Exemplary of the oxoalkyl groups of 4 to 20 carbon atoms are 3-oxocyclohexyl and groups represented by the following formulae.

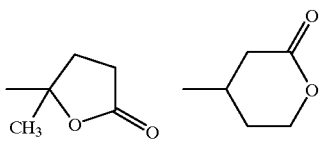

Exemplary of the aryl-substituted alkyl groups of 7 to 20 carbon atoms are benzyl, methylbenzyl, dimethylbenzyl, diphenylmethyl, and 1,1-diphenylethyl.

In the resist composition comprising a sulfonyldiazomethane of formula (1), the resin (A) may be the polymer of formula (2) or (2') in which some of the hydrogen atoms of the phenolic hydroxyl groups are replaced by acid labile groups of one or more types, and the hydrogen atoms of the remaining phenolic hydroxyl groups are crosslinked within a molecule and/or between molecules, in a proportion of more than 0 mol % to 50 mol %, on the average, of the entire phenolic hydroxyl groups on the polymer, with crosslinking groups having C—O—C linkages represented by the following general formula (3a) or (3b).

The crosslinking groups having C—O—C linkages are groups represented by the following general formula (3a) or (3b).

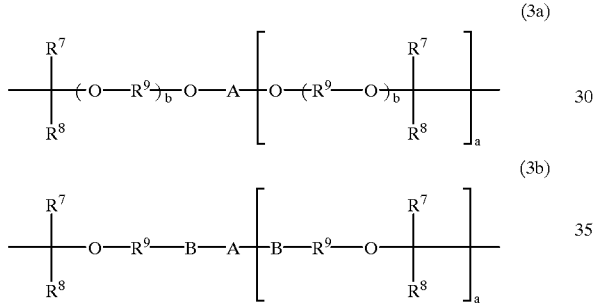

Herein, each of $R^7$ and R8 is hydrogen or a straight, branched or cyclic alkyl group of 1 to 8 carbon atoms, or $R^7$ and $R^8$, taken together, may form a ring, and each of $R^7$ and $R^8$ is a straight or branched alkylene group of 1 to 8 carbon atoms when they form a ring. $R^9$ is a straight, branched or cyclic alkylene group of 1 to 10 carbon atoms, letter a is an integer of 1 to 7, preferably 1 to 3, letter b is 0 or an integer of 1 to 10. A is an (a+1)-valent aliphatic or alicyclic saturated hydrocarbon group, aromatic hydrocarbon group or heterocyclic group of 1 to 50 carbon atoms, which may be separated by a hetero atom and in which some of the hydrogen atoms attached to carbon atoms may be replaced by hydroxyl, carboxyl, carbonyl or halogen. B is —CO—O—, —NHCO—O— or —NHCONH—.

Examples of the straight, branched or cyclic $C_{1-8}$ alkyl group represented by $R^7$ and $R^8$ are as exemplified for $R^5$.

Examples of the straight, branched or cyclic $C_{1-10}$ alkylene group represented by $R^9$ include methylene, ethylene, propylene, isopropylene, n-butylene, isobutylene, cyclohexylene, and cyclopentylene.

Exemplary halogen atoms are fluorine, chlorine, bromine and iodine.

Illustrative examples of A are described later. These crosslinking groups of formulae (3a) and (3b) originate from alkenyl ether compounds and halogenated alkyl ether compounds to be described later.

As understood from the value of "a" in formula (3a) or (3b), the crosslinking group is not limited to a divalent one and trivalent to octavalent groups are acceptable. For example, the divalent crosslinking group is exemplified by groups of the following formulas (3a') and (3b'), and the trivalent crosslinking group is exemplified by groups of the following formulas (3a") and (3b").

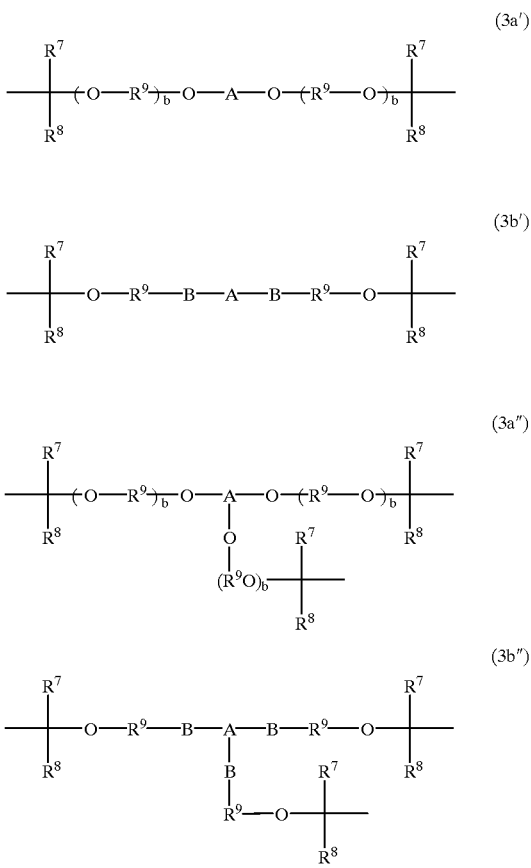

In the resist composition comprising the sulfonyldiazomethane of formula (1), the preferred polymer is a polymer comprising recurring units of the following general formula (2b) or (2b'), and more preferably the same polymer in which hydrogen atoms of phenolic hydroxyl groups represented by R are eliminated to leave oxygen atoms which are crosslinked within a molecule and/or between molecules with crosslinking groups having C—O—C linkages represented by the above formula (3a) or (3b).

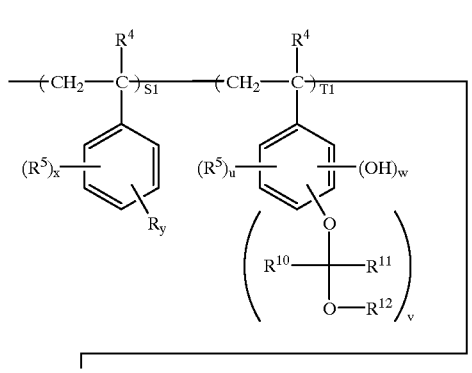

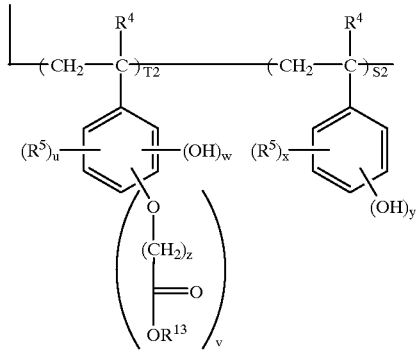

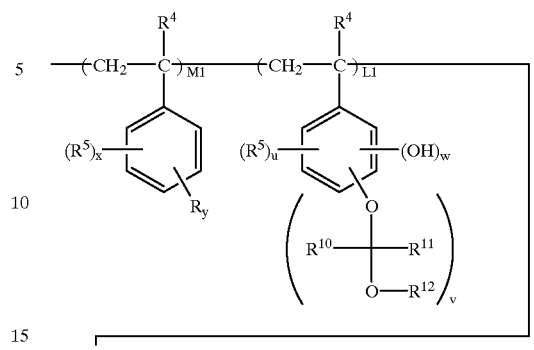

Herein, R represents a crosslinking group having C—O—C linkages, attached to an oxygen atom, represented by the above formula (3a) or (3b). $R^4$ is hydrogen or methyl, $R^5$ is a straight, branched or cyclic alkyl group of 1 to 8 carbon atoms. $R^{10}$ and $R^{11}$ are independently hydrogen or straight, branched or cyclic alkyl groups of 1 to 18 carbon atoms, $R^{12}$ is a monovalent hydrocarbon group of 1 to 18 carbon atoms which may have a hetero atom, or $R^{10}$ and $R^{11}$, $R^{10}$ and $R^{12}$, or $R^{11}$ and $R^{12}$, taken together, may form a ring, with the proviso that each of $R^{10}$, $R^{11}$ and $R^{12}$ is a straight or branched alkylene group of 1 to 18 carbon atoms when they form a ring. $R^{13}$ is a tertiary alkyl group of 4 to 20 carbon atoms, an aryl-substituted alkyl group of 7 to 20 carbon atoms, an oxoalkyl group of 4 to 20 carbon atoms or a group represented by —$CR^{10}R^{11}OR^{12}$. Letter z is an integer of 0 to 6. S2 is a positive number, each of S1, T1, and T2 is 0 or a positive number, satisfying $0 \leq S1/(S1+T1+T2+S2) \leq 0.8$, $0 \leq T1/(S1+T1+T2+S2) \leq 0.8$, $0 \leq T2/(S1+T1+T2+S2) \leq 0.8$, and $S1+T1+T2+S2=1$. T1 and T2 are not equal to 0 at the same time. Each of u and w is 0 or a positive integer, and v is a positive integer, satisfying $u+v+w<5$. Letters x and y are as defined above.

More preferably, S1, S2, T1 and T2 satisfy the following ranges.

$0 \leq S1/(S1+T1+T2+S2) \leq 0.5$,
especially $0.002 \leq S1/(S1+T1+T2+S2) \leq 0.2$ $0 \leq T1/(S1+T1+T2+S2) \leq 0.5$,
especially $0 \leq T1/(S1+T1+T2+S2) \leq 0.4$ $0 \leq T2/(S1+T1+T2+S2) \leq 0.5$,
especially $0 \leq T2/(S1+T1+T2+S2) \leq 0.4$ $0.4 \leq S2/(S1+T1+T2+S2) < 1$,
especially $0.5 \leq S2/(S1+T1+T2+S2) \leq 0.9$ $0 < (T1+T2)/(S1+T1+T2+S2) \leq 0.5$,
especially $0.1 \leq (T1+T2)/(S1+T1+T2+S2) \leq 0.4$ It is also preferred that T1/(T1+T2) be from 0 to 1, more preferably from 0.5 to 1, and most preferably from 0.7 to 1.

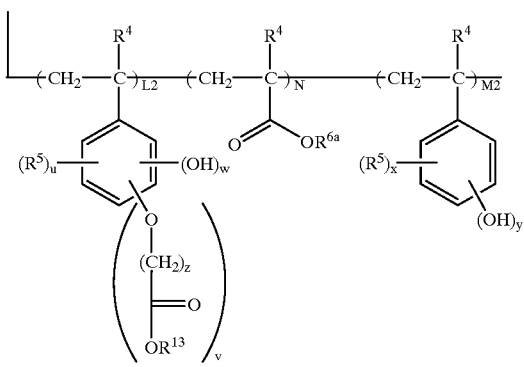

Herein, R represents a crosslinking group having C—O—C linkages, attached to an oxygen atom, represented by the above formula (3a) or (3b). $R^4$ is hydrogen or methyl, $R^5$ is a straight, branched or cyclic alkyl group of 1 to 8 carbon atoms. $R^{6a}$ is hydrogen or an acid labile group as mentioned above, and at least some, preferably all of the $R^{6a}$ groups are acid labile groups. $R^{10}$ and $R^{11}$ are independently hydrogen or straight, branched or cyclic alkyl groups of 1 to 18 carbon atoms, $R^{12}$ is a monovalent hydrocarbon group of 1 to 18 carbon atoms which may have a hetero atom, or $R^{10}$ and $R^{11}$, $R^{10}$ and $R^{12}$, or $R^{11}$ and $R^{12}$, taken together, may form a ring, with the proviso that each of $R^{10}$, $R^{11}$ and $R^{12}$ is a straight or branched alkylene group of 1 to 18 carbon atoms when they form a ring. $R^{13}$ is a tertiary alkyl group of 4 to 20 carbon atoms, an aryl-substituted alkyl group of 7 to 20 carbon atoms, an oxoalkyl group of 4 to 20 carbon atoms or a group represented by —$CR^{10}R^{11}OR^{12}$. Letter z is an integer of 0 to 6. M2 is a positive number, each of M1, L1, L2 and N is 0 or a positive number, satisfying $0 \leq M1/(M1+L1+L2+N+M2)$ 0.8, $0 \leq L1/(M1+L1+L2+N+M2) \leq 0.8$, $0 \leq L2/(M1+L1+L2+N+M2) \leq 0.8$, $0 \leq N/(M1+L1+L2+N+M2) \leq 0.8$, and $M1+L1+L2+N+M2=1$. L1, L2 and N are not equal to 0 at the same time. Each of u and w is 0 or a positive integer, and v is a positive integer, satisfying $u+v+w \leq 5$. Letters x and y are as defined above.

More preferably, M1, L1, L2, N and M2 satisfy the following ranges.

$0 \leq M1/(M1+L1+L2+N+M2) \leq 0.5$,
especially $0.002 \leq M1/(M1+L1+L2+N+M2) \leq 0.2$ $0 \leq L1/(M1+L1+L2+N+M2) \leq 0.5$, especially $0 \leq L1/(M1+L1+L2+N+M2) \leq 0.4$
$0 \leq L2/(M1+L1+L2+N+M2) \leq 0.5$,
especially $0 \leq L2/(M1+L1+L2+N+M2) \leq 0.4$
$0 \leq N/(M1+L1+L2+N+M2) \leq 0.5$,
especially $0 \leq N/(M1+L1+L2+N+M2) \leq 0.4$
$0.4 \leq M2/(M1+L1+L2+N+M2) < 1$,
especially $0.5 \leq M2/(M1+L1+L2+N+M2) \leq 0.9$
$0 < (L1+L2+N)/(M1+L1+L2+N+M2) \leq 0.5$,
especially $0.1 \leq (L1+L2+N)/(M1+L1+L2+N+M2) \leq 0.4$.

It is also preferred that $N/(L1+L2+N)$ be from 0 to 1, more preferably from 0.5 to 1, and most preferably from 0.7 to 1.

In this polymer as well, the total amount of the acid labile groups and crosslinking groups is, on the average, more than 0 mol % to 80 mol % based on the entire phenolic hydroxyl groups in formula (2b) or the phenolic hydroxyl groups and carboxyl groups in formula (2b') combined.

Examples of this polymer are those comprising recurring units of the following formulae (2b'-1) to (2b'-7).

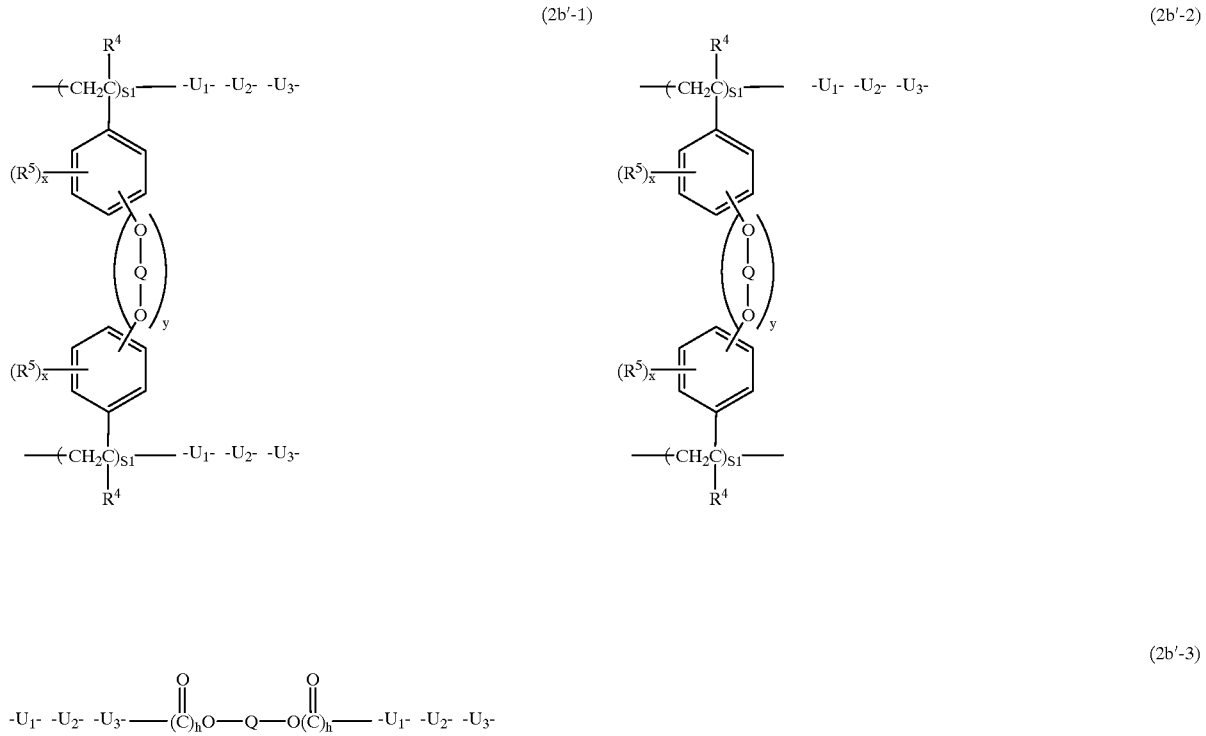

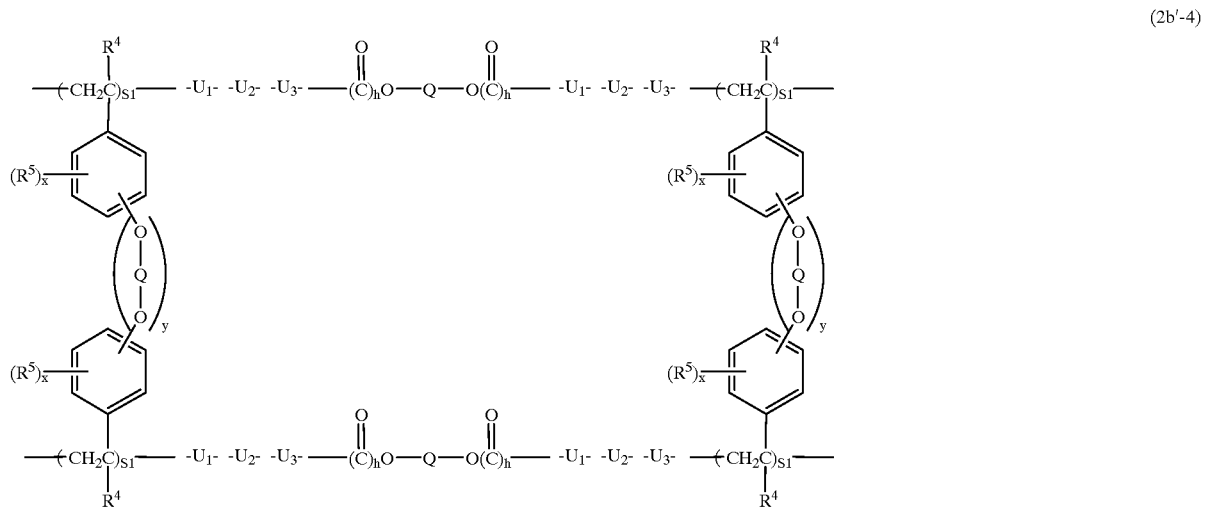

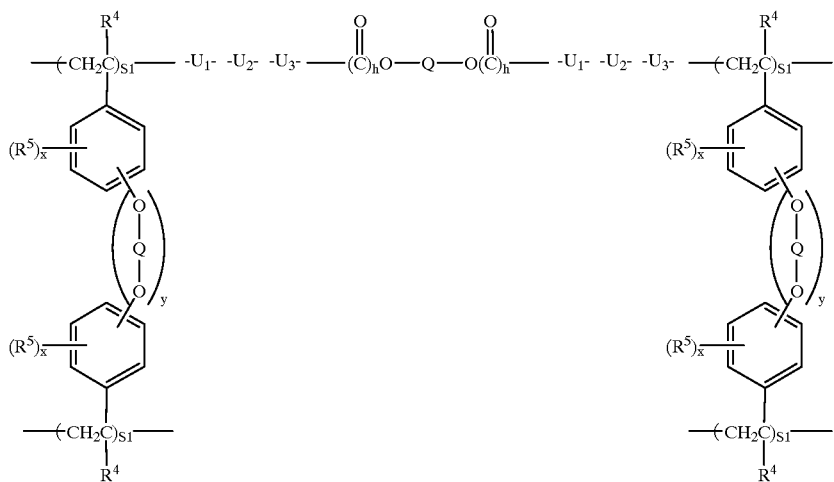
(2b'-5)
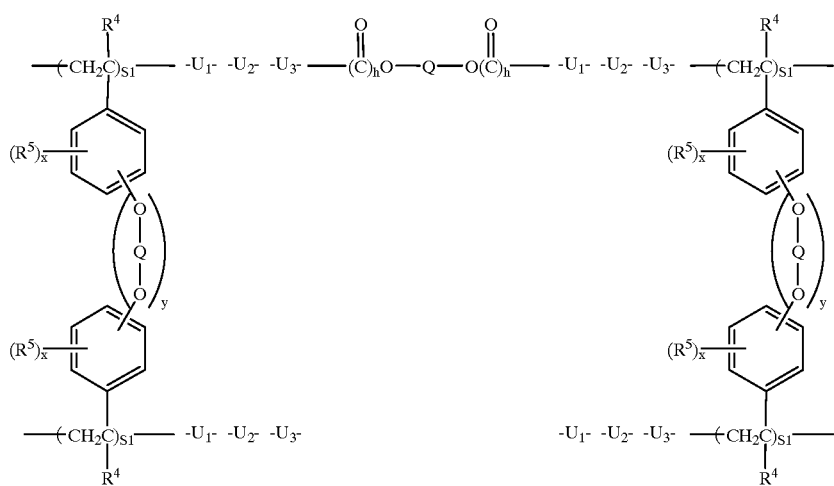
(2b'-6)
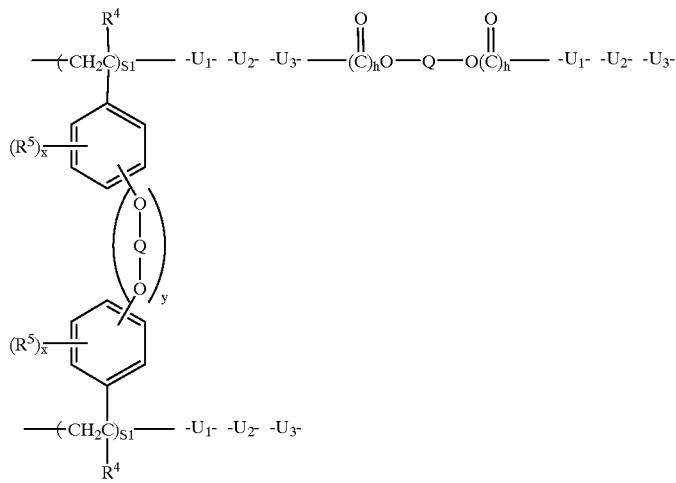
(2b'-7)

In the above formulae, h is equal to 0 or 1, y is an integer of 1 to 3, U1, U2 and U3 stand for the following units, respectively.

U₁:

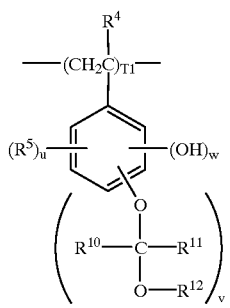

U₂:

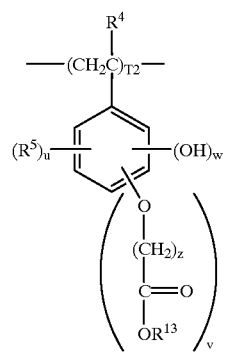

U₃:

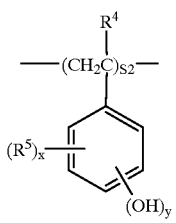

It is noted that U+W=X. Q is a crosslinking group having a C—O—C linkage, typically a crosslinking group represented by the above formula (3a) or (3b), especially a crosslinking group represented by the above formula (3a'), (3b') or (3a"), (3b"). It is noted that where the crosslinking group Q is trivalent or polyvalent, Q is attached to at least three units of the following formula in formula (2b).

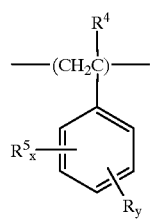

It is noted that the above formulae (2b'-2) and (2b'-5) show intramolecular bonded states and the remaining formulae show intermolecular bonded states, which may be present alone or in admixture.

Where the resin in the resist composition comprising a sulfonyldiazomethane of formula (1) as a photoacid generator is crosslinked with acid labile substituents, it is a polymer which is obtained by reacting phenolic hydroxyl groups with an alkenyl ether compound or halogenated alkyl ether such that the polymer is crosslinked within a molecular and/or between molecules with crosslinking groups having C—O—C linkages, wherein the total amount of the acid labile groups and crosslinking groups is preferably, on the average, more than 0 mol % to 80 mol %, especially 2 to 50 mol %, based on the entire phenolic hydroxyl groups in formula (2) or the phenolic hydroxyl groups and carboxyl groups in formula (2') combined.

The proportion of crosslinking groups having C—O—C linkages is, on the average, from more than 0 mol % to 50 mol %, and especially from 0.2 to 20 mol %. With 0 mol %, few benefits of the crosslinking group are obtained, resulting in a reduced contrast of alkali dissolution rate and a low resolution. With more than 50 mol %, a too much crosslinked polymer would gel, become insoluble in alkali, induce a film thickness change, internal stresses or bubbles upon alkali development, and lose adhesion to the substrate due to less hydrophilic groups.

The proportion of acid labile groups is on the average preferably from more than 0 mol % to 80 mol %, especially from 10 to 50 mol %. With 0 mol %, there may result a reduced contrast of alkali dissolution rate and low resolution. With more than 80 mol %, there may result a loss of alkali dissolution, less affinity to an alkali developer upon development, and a low resolution.

By properly selecting the proportions of crosslinking groups having C—O—C linkages and acid labile groups within the above-defined ranges, it becomes possible to control the size and configuration of a resist pattern as desired. In the resist composition using the sulfonyldiazomethane according to the invention, the contents of crosslinking groups having C—O—C linkages and acid labile groups in the polymer have substantial influence on the dissolution rate contrast of a resist film and govern the properties of the resist composition relating to the size and configuration of a resist pattern.

Now A in the crosslinking group is described. The (a+1)-valent organic groups represented by A include hydrocarbon groups, for example, substituted or unsubstituted alkylene groups preferably having 1 to 50 carbon atoms, and especially 1 to 40 carbon atoms, substituted or unsubstituted arylene groups preferably having 6 to 50 carbon atoms, and especially 6 to 40 carbon atoms (these alkylene and arylene groups may have an intervening hetero atom or group such as O, NH, N(CH₃), S or SO₂, and where substituted, the substituents are hydroxyl, carboxyl, acyl and fluorine), and combinations of these alkylene groups with these arylene groups. Additional examples include (a+1)-valent heterocyclic groups, and combinations of these heterocyclic groups with the foregoing hydrocarbon groups.

Illustrative examples of A are given below.

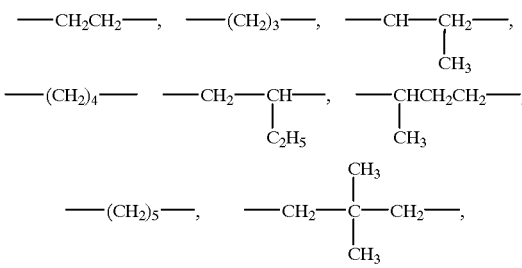

-continued

-continued

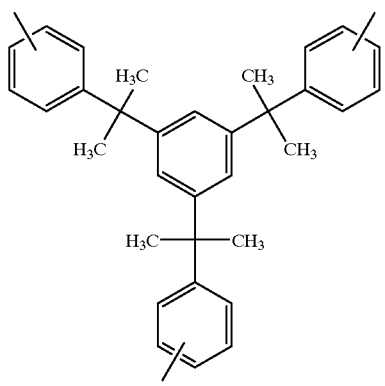

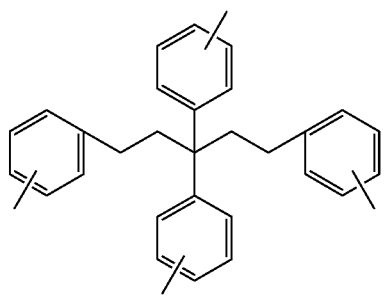

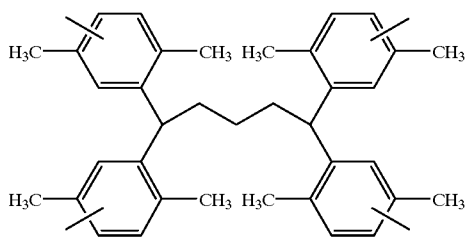

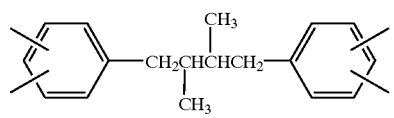

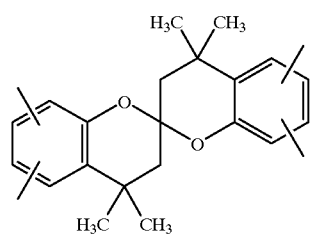

-continued

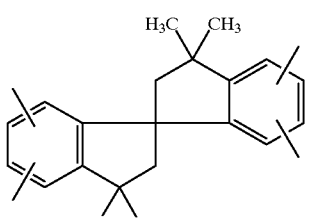

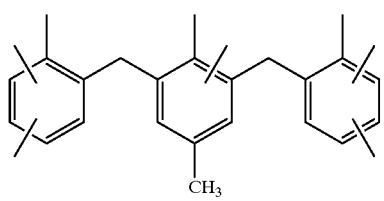

Preferably, in formula (3a), $R^7$ is methyl, $R^8$ is hydrogen, b is equal to 0, and A is ethylene, 1,4-butylene or 1,4-cyclohexylene.

In preparing the polymer which is crosslinked within a molecular and/or between molecules with crosslinking groups having C—O—C linkages, synthesis may be made by reacting a corresponding non-crosslinked polymer with an alkenyl ether in the presence of an acid catalyst in a conventional manner.

Alternatively, where decomposition of other acid labile groups takes place in the presence of an acid catalyst, the end product can be synthesized by first reacting an alkenyl ether with hydrochloric acid or the like to form a halogenated alkyl ether, and reacting it with a polymer under basic conditions in a conventional manner.

Illustrative, non-limiting, examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, neopentyl glycol divinyl ether, trimethylolpropane trivinyl ether, trimethylolethane trivinyl ether, hexanediol divinyl ether, 1,4-cyclohexane-diol divinyl ether, 1,4-divinyloxymethylcyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pantaerythritol triethylene vinyl ether, pentaerythritol tetraethylene vinyl ether, and the compounds of the following formulae (I-1) through (I-31).

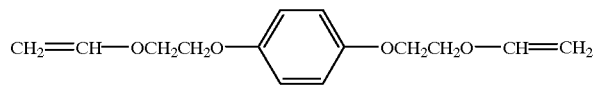
(I-1)
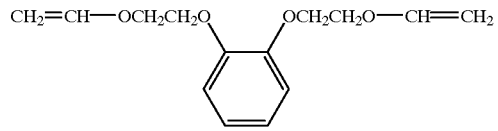
(I-2)
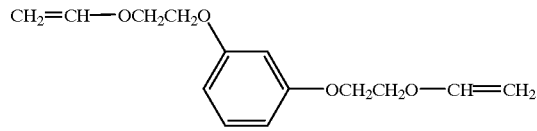
(I-3)
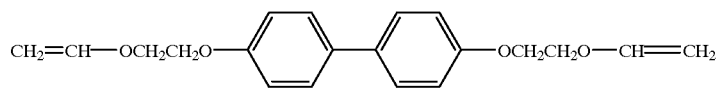
(I-4)
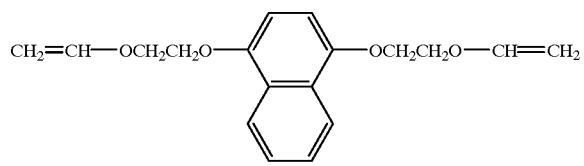
(I-5)
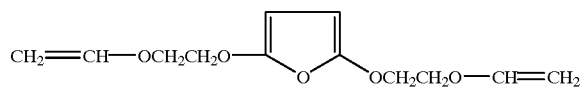
(I-6)
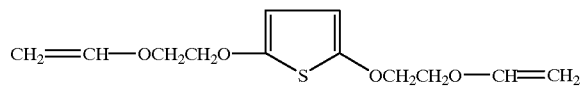
(I-7)
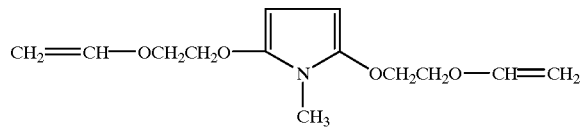
(I-8)
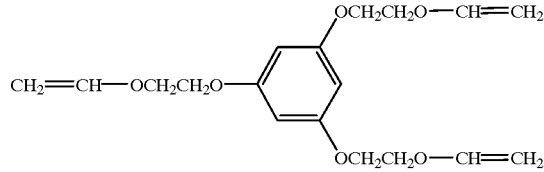
(I-9)
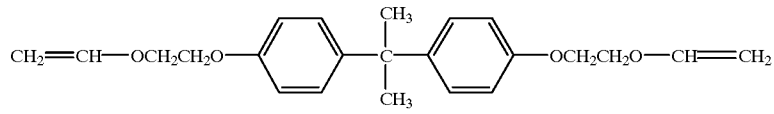
(I-10)
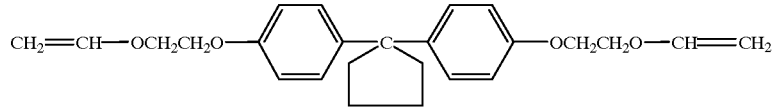
(I-11)

-continued
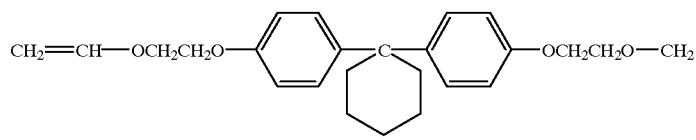
(I-12)
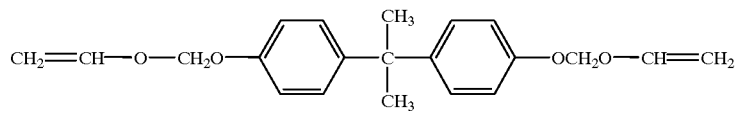
(I-13)
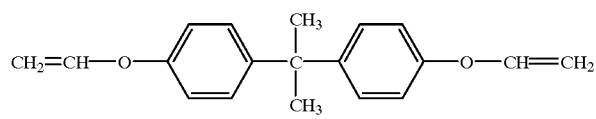
(I-14)
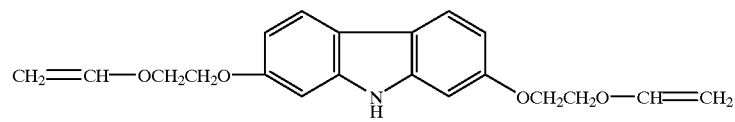
(I-15)
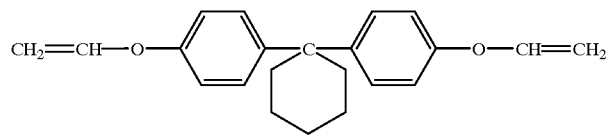
(I-16)
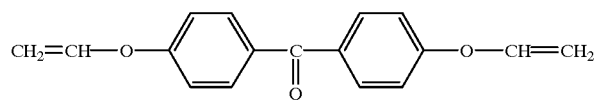
(I-17)
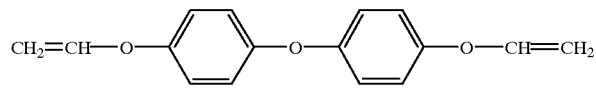
(I-18)
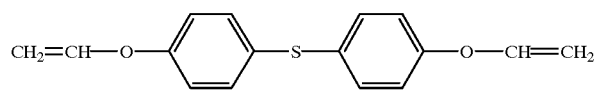
(I-19)
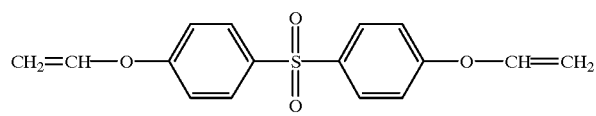
(I-20)
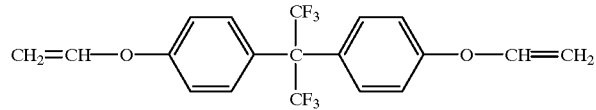
(I-21)

-continued
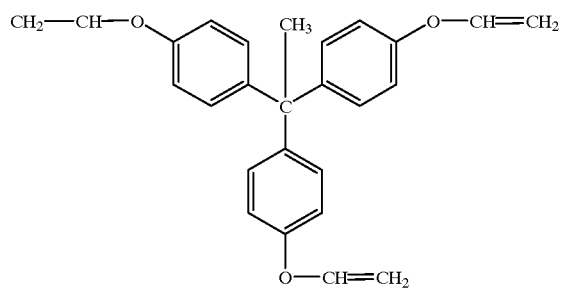
(I-22)
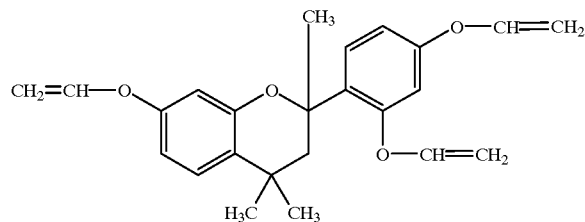
(I-23)
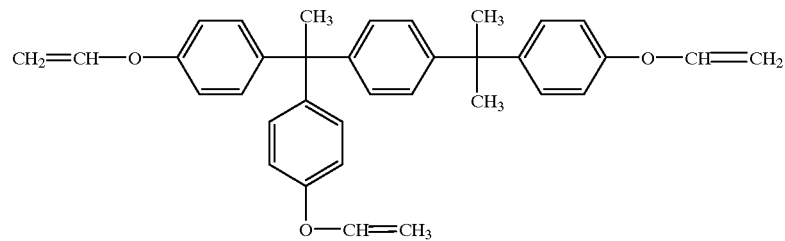
(I-24)
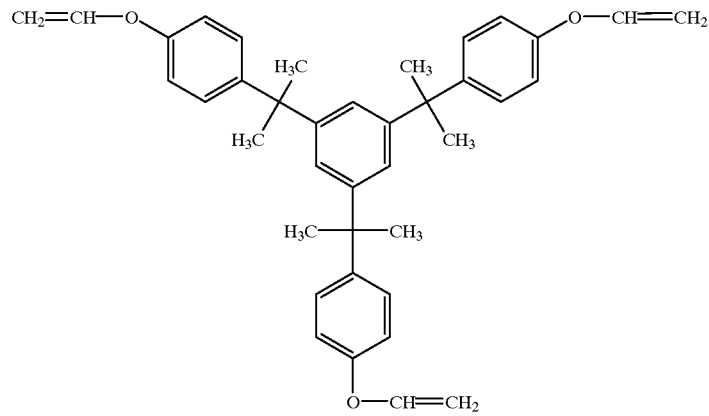
(I-25)
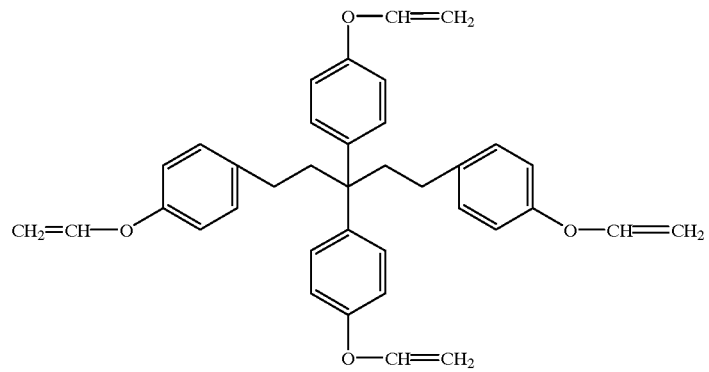
(I-26)

-continued
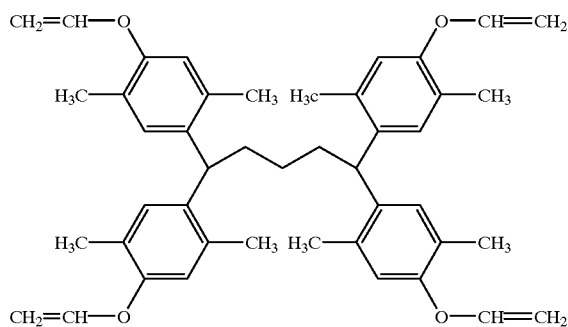
(I-27)
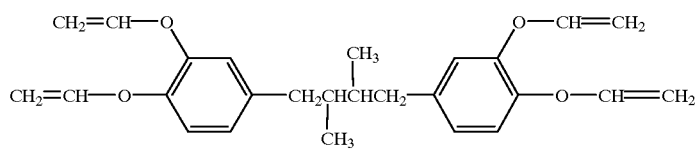
(I-28)
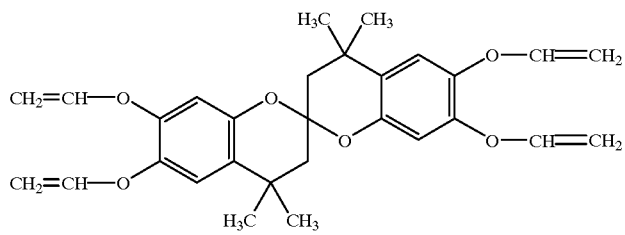
(I-29)
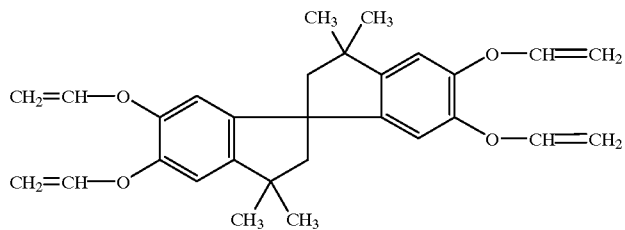
(I-30)
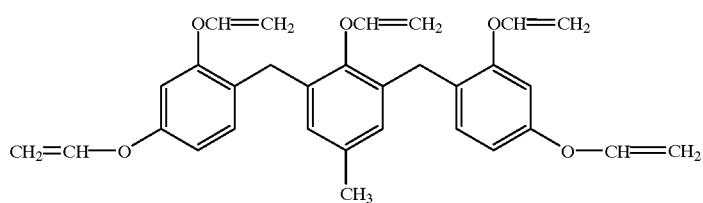
(I-31)

Also useful are terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether, itaconic acid diethylene vinyl ether as well as the compounds of the following formulae (II-1) through (II-11). Useful alkenyl ethers are not limited to these examples.

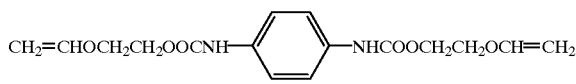

(II-1)

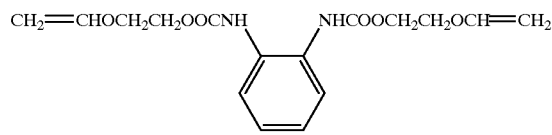

(II-2)

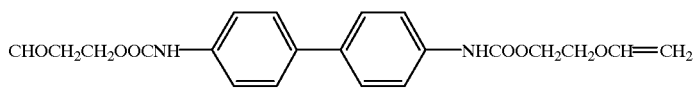

(II-3)

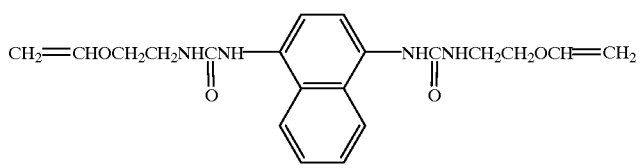

(II-4)

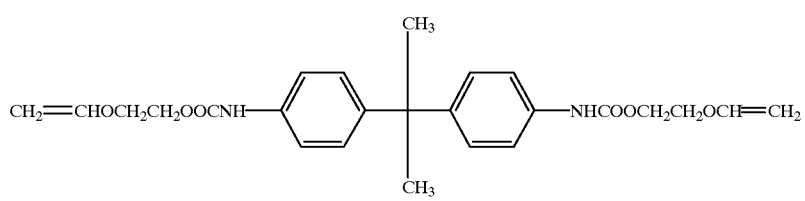

(II-5)

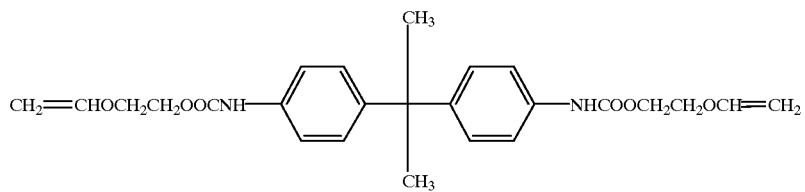

(II-6)

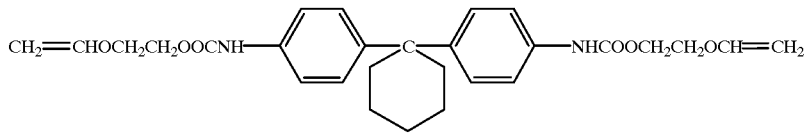

(II-7)

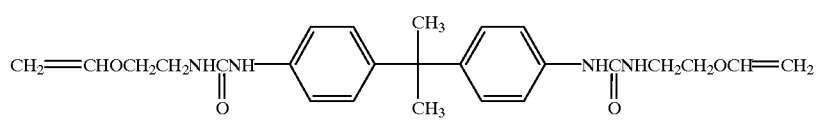

(II-8)

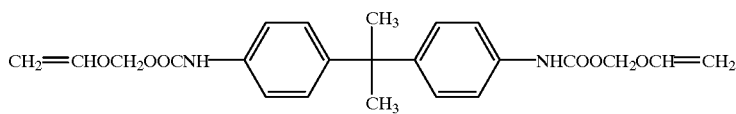

(II-9)

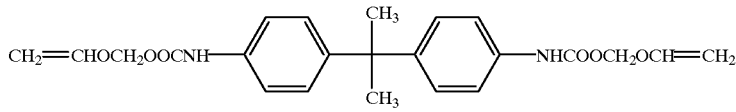

(II-10)

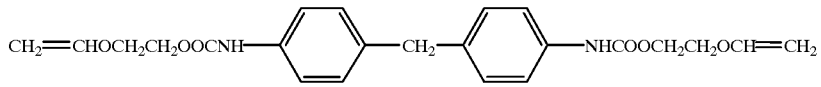

(II-11)

In the resist composition comprising the sulfonyldiazomethane according to the invention, the resin used as component (A) is as described above while the preferred acid labile groups introduced therein are 1-ethylcyclohexyl, 1-ethylcyclopentyl, 1-ethylcyclohexyloxy-carbonylmethyl, tert-amyl, 1-ethoxyethyl, 1-ethoxypropyl, tetrahydrofuranyl, tetrahydropyranyl, tert-butyl, 1-ethylcyclohexyl, tert-butoxycarbonyl, tert-butoxycarbonyl-methyl groups, and substituents of formula (3a) wherein $R^7$ is methyl, $R^8$ is hydrogen, b is equal to 0, and A is ethylene, 1,4-butylene or 1,4-cyclohexylene.

In a single polymer, these substituents may be incorporated alone or in admixture of two or more types. A blend of two or more polymers having substituents of different types is also acceptable.

Appropriate combinations of substituents of two or more types include a combination of acetal with acetal analog, a combination of acetal with a substituent having a different degree of scission by acid such as tert-butoxy, a combination of a crosslinking acid labile group with acetal, and a combination of a crosslinking acid labile group with a substituent having a different degree of scission by acid such as tert-butoxy.

The percent proportion of these substituents substituting for phenol and carboxyl groups in the polymer is not critical. Preferably the percent substitution is selected such that when a resist composition comprising the polymer is applied onto a substrate to form a coating, the unexposed area of the coating may have a dissolution rate of 0.01 to 10 Å/sec in a 2.38% tetramethylammonium hydroxide (TMAH) developer.

On use of a polymer containing a greater proportion of carboxyl groups which can reduce the alkali dissolution rate, the percent substitution must be increased or non-acid-labile substituents to be described later must be introduced.

When acid labile groups for intramolecular and/or intermolecular crosslinking are to be introduced, the percent proportion of crosslinking substituents is preferably up to 20%, more preferably up to 10%. If the percent substitution of crosslinking substituents is too high, crosslinking results in a higher molecular weight which can adversely affect dissolution, stability and resolution. It is also preferred to further introduce another non-crosslinking acid labile group into the crosslinked polymer at a percent substitution of up to 10% for adjusting the dissolution rate to fall within the above range.

In the case of poly(p-hydroxystyrene), the optimum percent substitution differs between a substituent having a strong dissolution inhibitory action such as a tert-butoxycarbonyl group and a substituent having a weak dissolution inhibitory action such as an acetal group although the overall percent substitution is preferably 10 to 40%, more preferably 20 to 30%.

Polymers having such acid labile groups introduced therein should preferably have a weight average molecular weight (Mw) of 3,000 to 100,000. With a Mw of less than 3,000, polymers would perform poorly and often lack heat resistance and film formability. Polymers with a Mw of more than 100,000 would be less soluble in a developer and a resist solvent.

Where non-crosslinking acid labile groups are introduced, the polymer should preferably have a dispersity (Mw/Mn) of up to 3.5, preferably up to 1.5. A polymer with a dispersity of more than 3.5 often results in a low resolution. Where crosslinking acid labile groups are introduced, the starting alkali-soluble resin should preferably have a dispersity (Mw/Mn) of up to 1.5, and the dispersity is kept at 3 or lower even after protection with crosslinking acid labile groups. If the dispersity is higher than 3, dissolution, coating, storage stability and/or resolution is often poor.

To impart a certain function, suitable substituent groups may be introduced into some of the phenolic hydroxyl and carboxyl groups on the acid labile group-protected polymer. Exemplary are substituent groups for improving adhesion to the substrate, non-acid-labile groups for adjusting dissolution in an alkali developer, and substituent groups for improving etching resistance. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxoranyl, 4-methyl-2-oxo-4-oxanyl, methyl, ethyl, propyl, n-butyl, sec-butyl, acetyl, pivaloyl, adamantyl, isobornyl, and cyclohexyl.

Illustrative examples of the sulfonyldiazomethane compounds of formulae (1) and (1a) as the photoacid generator are as described above. Listing again, examples include bis(4-methanesulfonyloxyphenylsulfonyl)diazomethane, bis (4-ethanesulfonyloxyphenylsulfonyl)diazomethane, bis(4-(n-propanesulfonyloxy)phenylsulfonyl) diazomethane, bis(4-(n-butanesulfonyloxy)phenylsulfonyl) diazomethane, bis(4-cyclohexylsulfonyloxyphenylsulfonyl) diazomethane, bis(4-benzenesulfonyloxyphenylsulfonyl)diazomethane, bis(4-(4'-toluenesulfonyloxy)phenylsulfonyl) diazomethane, (4-methanesulfonyloxyphenylsulfonyl) (methylsulfonyl) diazomethane, (4-methanesulfonyloxyphenylsulfonyl)(tert-butylsulfonyl)diazomethane, (4-methanesulfonyloxyphenylsulfonyl) (cyclohexylsulfonyl)diazomethane, (4-methanesulfonyloxyphenylsulfonyl) (benzenesulfonyl)diazomethane, (4-methanesulfonyloxyphenylsulfonyl)(p-toluenesulfonyl)diazomethane, (4-methanesulfonyloxyphenylsulfonyl)(2,4-dimethylphenylsulfonyl)diazomethane, (4-methanesulfonyloxyphenylsulfonyl)(4-tert-butylphenylsulfonyl)diazomethane, (4-methanesulfonyloxyphenylsulfonyl)(4-tert-butoxyphenylsulfonyl)diazomethane, (4-ethanesulfonyloxyphenylsulfonyl)(methylsulfonyl) diazomethane, (4-ethanesulfonyloxyphenylsulfonyl)(tert-butylsulfonyl)diazomethane,
(4-ethanesulfonyloxyphenylsulfonyl)(cyclohexylsulfonyl)diazomethane,
(4-ethanesulfonyloxyphenylsulfonyl)(benzenesulfonyl)diazomethane,
(4-ethanesulfonyloxyphenylsulfonyl)(p-toluenesulfonyl)diazomethane,
(4-ethanesulfonyloxyphenylsulfonyl)(2,4-dimethylphenylsulfonyl)diazomethane,
(4-ethanesulfonyloxyphenylsulfonyl)(4-tert-butylphenylsulfonyl)diazomethane,
(4-ethanesulfonyloxyphenylsulfonyl)(4-tert-butoxyphenylsulfonyl)diazomethane,
(4-n-butanesulfonyloxyphenylsulfonyl)(methylsulfonyl)diazomethane,
(4-n-butanesulfonyloxyphenylsulfonyl)(tert-butylsulfonyl)diazomethane,
(4-n-butanesulfonyloxyphenylsulfonyl)(cyclohexylsulfonyl)diazomethane,
(4-n-butanesulfonyloxyphenylsulfonyl)(benzenesulfonyl)diazomethane,
(4-n-butanesulfonyloxyphenylsulfonyl)(p-toluenesulfonyl)diazomethane,
(4-n-butanesulfonyloxyphenylsulfonyl)(2,4-dimethylphenylsulfonyl)diazomethane,
(4-n-butanesulfonyloxyphenylsulfonyl)(4-tert-butylphenylsulfonyl)diazomethane,
(4-n-butanesulfonyloxyphenylsulfonyl)(4-tert-butoxyphenylsulfonyl)diazomethane,
(4-methanesulfonyloxyphenylsulfonyl)(methylcarbonyl)diazomethane,
(4-methanesulfonyloxyphenylsulfonyl)(tert-butylcarbonyl)diazomethane,
(4-methanesulfonyloxyphenylsulfonyl)(cyclohexylcarbonyl)diazomethane,
(4-methanesulfonyloxyphenylsulfonyl)(benzoyl)diazomethane,
(4-methanesulfonyloxyphenylsulfonyl)(p-toluenecarbonyl)diazomethane,
(4-methanesulfonyloxyphenylsulfonyl)(2,4-dimethylphenylcarbonyl)diazomethane,
(4-methanesulfonyloxyphenylsulfonyl)(4-tert-butylphenylcarbonyl)diazomethane,
(4-methanesulfonyloxyphenylsulfonyl)(4-tert-butoxyphenylcarbonyl)diazomethane,
(4-ethanesulfonyloxyphenylsulfonyl)(methylcarbonyl)diazomethane,
(4-ethanesulfonyloxyphenylsulfonyl)(tert-butylcarbonyl)diazomethane,
(4-ethanesulfonyloxyphenylsulfonyl)(cyclohexylcarbonyl)diazomethane,
(4-ethanesulfonyloxyphenylsulfonyl)(benzoyl)diazomethane,
(4-ethanesulfonyloxyphenylsulfonyl)(p-toluenecarbonyl)diazomethane,
(4-ethanesulfonyloxyphenylsulfonyl)(2,4-dimethylphenylcarbonyl)diazomethane,
(4-ethanesulfonyloxyphenylsulfonyl)(4-tert-butylphenylcarbonyl)diazomethane,
(4-ethanesulfonyloxyphenylsulfonyl)(4-tert-butoxyphenylcarbonyl)diazomethane,
(4-n-butanesulfonyloxyphenylsulfonyl)(methylcarbonyl)diazomethane,
(4-n-butanesulfonyloxyphenylsulfonyl)(tert-butylcarbonyl)diazomethane,
(4-n-butanesulfonyloxyphenylsulfonyl)(cyclohexylcarbonyl)diazomethane,
(4-n-butanesulfonyloxyphenylsulfonyl)(benzoyl)diazomethane,
(4-n-butanesulfonyloxyphenylsulfonyl)(p-toluenecarbonyl)diazomethane,
(4-n-butanesulfonyloxyphenylsulfonyl)(2,4-dimethylphenylcarbonyl)diazomethane,
(4-n-butanesulfonyloxyphenylsulfonyl)(4-tert-butylphenylcarbonyl)diazomethane,
(4-n-butanesulfonyloxyphenylsulfonyl)(4-tert-butoxyphenylcarbonyl)diazomethane, etc.

More preferred are those of the above formula (1a), specifically bis(4-methanesulfonyloxyphenylsulfonyl)diazomethane, bis(4-ethanesulfonyloxyphenylsulfonyl)diazomethane and bis(4-(n-butanesulfonyloxy)phenylsulfonyl)diazomethane.

In the chemical amplification, positive working, resist composition, an appropriate amount of the sulfonyldiazomethane compound of formula (1) added is from more than 0 part to 20 parts by weight, and preferably from 1 to 10 parts by weight, per 100 parts by weight of the solids in the composition. The photoacid generators may be used alone or in admixture of two or more. The transmittance of the resist film can be controlled by using a photoacid generator having a low transmittance at the exposure wavelength and adjusting the amount of the photoacid generator added.

Component (C)

In one preferred embodiment, the resist composition further contains (C) a compound capable of generating an acid upon exposure to high energy radiation, that is, a second photoacid generator other than the sulfonyl diazomethane (B). Examples of the second photoacid generator are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)-phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, dimethylphenylsulfonium, diphenylmethylsulfonium, methyl-2-oxopropylphenylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl) iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)-diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)-diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-a-diphenylglyoxime, bis-o-(n-butanesulfonyl)-a-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bissulfonyldiazomethane compounds, and N-sulfonyloxyimide compounds are preferred. While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions. In the resist composition comprising the sulfonyldiazomethane as the first photoacid generator according to the invention, an appropriate amount of the second photoacid generator is 0 to 20 parts, and especially 1 to 10 parts by weight per 100 parts by weight of the solids in the composition. The second photoacid generators may be used alone or in admixture of two or more. The transmittance of the resist film can be controlled by using a (second) photoacid generator having a low transmittance at the exposure wavelength and adjusting the amount of the photoacid generator added.

In the resist composition comprising the sulfonyldiazomethane as the photoacid generator according to the invention, there may be added a compound which is decomposed with an acid to generate an acid, that is, acid-propagating compound. For these compounds, reference should be made to J. Photopolym. Sci. and Tech., 8, 43–44, 45–46 (1995), and ibid., 9, 29–30 (1996).

Examples of the acid-propagating compound include tert-butyl-2-methyl-2-tosyloxymethyl acetoacetate and 2-phenyl-2-(tosyloxyethyl)-1,3-dioxoran, but are not limited thereto. Of well-known photoacid generators, many of those compounds having poor stability, especially poor thermal stability exhibit an acid-propagating compound-like behavior.

In the resist composition comprising the sulfonyldiazomethane as the photoacid generator according to the invention, an appropriate amount of the acid-propagating compound is up to 2 parts, and especially up to 1 part by weight per 100 parts by weight of the solids in the composition. Excessive amounts of the acid-propagating compound makes diffusion control difficult, leading to degradation of resolution and pattern configuration.

Component (G)

In one preferred embodiment, the resist composition further contains (G) a compound with a molecular weight of up to 3,000 which changes its solubility in an alkaline developer under the action of an acid, that is, a dissolution inhibitor. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified as the acid labile groups in the polymer.

Illustrative, non-limiting, examples of the dissolution inhibitors which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl) valerate,
tert-butyl 4,4-bis(4'-tert-butoxycarbonylmethyloxyphenyl)valerate,
tert-butyl 4,4-bis(4'-(1"-ethoxyethoxy)phenyl)valerate,
tert-butyl 4,4-bis(4'-(1"-ethoxypropyloxy)phenyl) valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl) ethane,
1,1,2-tris(4'-(1'-ethoxyethoxy)phenyl)ethane, and
1,1,2-tris(4'-(1'-ethoxypropyloxy)phenyl)ethane.

In the resist composition comprising the sulfonyl- diazomethane of formula (1) as the photoacid generator according to the invention, an appropriate amount of the dissolution inhibitor is up to 20 parts, and especially up to 15 parts by weight per 100 parts by weight of the solids in the composition. With more than 20 parts of the dissolution inhibitor, the resist composition becomes less heat resistant because of an increased content of monomer components.

Component (H)

In a chemical amplification, negative working, resist composition as well, the sulfonyldiazomethane of formula (1) according to the invention may be used as the photoacid generator. This composition further contains an alkali-soluble resin as component (H), examples of which are intermediates of the above-described component (A) though not limited thereto. Examples of the alkali-soluble resin include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene- α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-acrylic acid copolymers, p-hydroxystyrene-methacrylic acid copolymers, p-hydroxystyrene-methyl methacrylate copolymers, p-hydroxystyrene-acrylic acid-methyl methacrylate copolymers, p-hydroxystyrene-methyl acrylate copolymers, p-hydroxystyrene-methacrylic acid-methyl methacrylate copolymers, poly(methacrylic acid), poly(acrylic acid), acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers, but are not limited to these combinations.

Preferred are poly(p-hydroxystyrene), partially hydrogenated p-hydroxystyrene copolymers, p-hydroxystyrenestyrene copolymers, p-hydroxystyrene-acrylic acid copolymers, and p-hydroxystyrene-methacrylic acid copolymers.

Alkali-soluble resins comprising units of the following formula (2) or (2') are especially preferred.

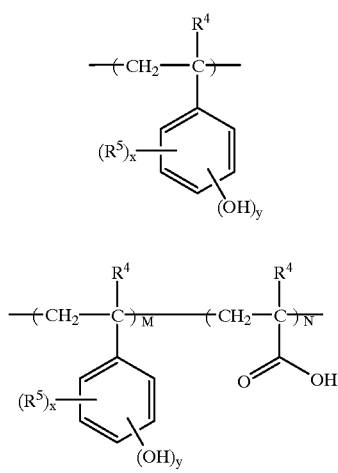

Herein $R^4$ is hydrogen or methyl, $R^5$ is a straight, branched or cyclic alkyl group of 1 to 8 carbon atoms, x is 0 or a positive integer, y is a positive integer, satisfying $x+y \leq 5$, and M and N are positive integers, satisfying $0 < N/(M+N) \leq 0.5$.

The polymer should preferably have a weight average molecular weight (Mw) of 3,000 to 100,000. Many polymers with Mw of less than 3,000 do not perform well and are poor in heat resistance and film formation. Many polymers with Mw of more than 100,000 give rise to a problem with respect to dissolution in the resist solvent and developer. The polymer should also preferably have a dispersity (Mw/Mn) of up to 3.5, and more preferably up to 1.5. With a dispersity of more than 3.5, resolution is low in many cases. Although the preparation method is not critical, a poly(p-hydroxystyrene) or similar polymer with a low dispersity or narrow dispersion can be synthesized by living anion polymerization.

To impart a certain function, suitable substituent groups may be introduced into some of the phenolic hydroxyl and carboxyl groups on the acid labile group-protected polymer. Exemplary and preferred are substituent groups for improving adhesion to the substrate, substituent groups for improving etching resistance, and especially substituent groups which are relatively stable against acid and alkali and effective for controlling such that the dissolution rate in an alkali developer of unexposed and low exposed areas of a resist film may not become too high. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxoranyl, 4-methyl-2-oxo-4-oxanyl, methyl, ethyl, n-propyl, isopropyl, n-butyl, sec-butyl, acetyl, pivaloyl, adamantyl, isobornyl, and cyclohexyl. It is also possible to introduce acid-decomposable substituent groups such as t-butoxycarbonyl and relatively acid-undecomposable substituent groups such as t-butyl and t-butoxycarbonylmethyl.

Also contained in the negative resist composition is (I) an acid crosslinking agent capable of forming a crosslinked structure under the action of an acid. Typical acid crosslinking agents are compounds having at least two hydroxymethyl, alkoxymethyl, epoxy or vinyl ether groups in a molecule. Substituted glycoluril derivatives, urea derivatives, and hexa(methoxymethyl)melamine compounds are suitable as the acid crosslinking agent in the chemically amplified, negative resist composition comprising the sulfonyldiazomethane. Examples include N,N,N',N'-tetramethoxymethylurea, hexamethoxymethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred acid crosslinking agents are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethyl bisphenol A, 1,4-bis[2-(2-hydroxypropyl)]benzene, N,N,N',N'-tetramethoxymethylurea, and hexamethoxymethylmelamine.

In the resist composition, an appropriate amount of the acid crosslinking agent is up to about 20 parts, and especially about 5 to 15 parts by weight per 100 parts by weight of the solids in the composition.

In the resist composition comprising the sulfonyldiazomethane as the photoacid generator according to the invention, there may be added such additives as (D) a basic compound for PED stability, (E) an organic acid derivative, a surfactant for improving coating, and a light absorbing agent for reducing diffuse reflection from the substrate.

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, truisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'- tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl) isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Also useful are substituted ones of the hydroxyl group-bearing nitrogenous compounds in which some or all of the hydrogen atoms of hydroxyl groups are replaced by methyl, ethyl, methoxymethyl, methoxyethoxymethyl, acetyl, or ethoxyethyl groups. Preferred are methyl-, acetyl-, methoxymethyl- and methoxyethoxymethyl-substituted compounds of ethanolamine, diethanolamine and triethanolamine. Examples include tris(2-methoxyethyl)amine, tris(2-ethoxyethyl)amine, tris(2-acetoxyethyl)amine, tris{2-(methoxymethoxy)ethyl}amine, tris{2-(methoxyethoxy)-ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)-ethyl}amine, and tris[2-{(2-hydroxyethoxy)ethoxy}ethyl]amine.

The basic compounds may be used alone or in admixture of two or more. The basic compound is preferably formulated in an amount of 0 to 2 parts, and especially 0.01 to 1 part, per 100 parts by weight of the solids in the resist composition. The use of more than 2 parts of the basis compound would result in too low a sensitivity.

Illustrative, non-limiting, examples of the organic acid derivatives (E) include phenol, cresol, catechol, resorcinol, pyrogallol, fluoroglycin, bis(4-hydroxyphenyl)methane, 2,2-bis(4'-hydroxyphenyl)propane, bis(4-hydroxyphenyl) sulfone, 1,1,1-tris(4'-hydroxyphenyl)ethane, 1,1,2-tris(4'-hydroxyphenyl)ethane, hydroxybenzophenone, 4-hydroxyphenylacetic acid, 3-hydroxyphenylacetic acid, 2-hydroxyphenylacetic acid, 3-(4-hydroxyphenyl)propionic acid, 3-(2-hydroxyphenyl)propionic acid, 2,5-dihydroxyphenylacetic acid, 3,4-dihydroxyphenylacetic acid, 1,2-phenylenediacetic acid, 1,3-phenylenediacetic acid, 1,4-phenylenediacetic acid, 1,2-phenylenedioxydiacetic acid, 1,4-phenylenedipropanoic acid, benzoic acid, salicylic acid, 4,4-bis(4'-hydroxyphenyl) valeric acid, 4-tert-butoxyphenylacetic acid, 4-(4-hydroxyphenyl)butyric acid, 3,4-dihydroxymandelic acid, and 4-hydroxymandelic acid. Of these, salicylic acid and 4,4-bis(4'-hydroxyphenyl)valeric acid are preferred. They may be used alone or in admixture of two or more.

In the resist composition comprising the sulfonyldiazomethane as the photoacid generator according to the invention, the organic acid derivative is preferably formulated in an amount of up to 5 parts, and especially up to 1 part, per 100 parts by weight of the solids in the resist composition. The use of more than 5 parts of the organic acid derivative would result in too low a resolution. Depending on the combination of the other components in the resist composition, the organic acid derivative may be omitted.

In the resist composition comprising the sulfonyldiazomethane as the photoacid generator according to the invention, a surfactant may be added.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF342 (Tohkem Products K.K.), Megaface F171, F172 and F173 (Dai-Nippon Ink & Chemicals K.K.), Florade FC430 and FC431, (Sumitomo 3M K.K.), Aashiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381, Surfynol E1004, KH-20 and KH-30 are preferred. These surfactants may be used alone or in admixture.

In the resist composition comprising the sulfonyldiazomethane as the photoacid generator according to the invention, the surfactant is preferably formulated in an amount of up to 2 parts, and especially up to 1 part, per 100 parts by weight of the solids in the resist composition.

In the resist composition comprising the sulfonyldiazomethane as the photoacid generator according to the invention, a UV absorber may be added.

Exemplary UV absorbers are fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (D1) and (D2); fused heterocyclic derivatives such as thioxanthen-9-one, thianthrene, dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; squalic acid derivatives such as squalic acid and dimethyl squalate; diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy) phenyl]sulfone, and bis[4-(1-ethoxypropoxy)phenyl] sulfone; diazo compounds such as benzoquinonediazide, naphthoquinonediazide, anthraquinonediazide, diazofluorene, diazotetralone, and diazophenanthrone; quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone; tert-butyl 9-anthracenecarboxylate, tert-amyl 9-anthracenecarboxylate, tert-methoxymethyl 9-anthracenecarboxylate, tert-ethoxyethyl 9-anthracenecarboxylate, 2-tert-tetrahydropyranyl 9-anthracenecarboxylate, and 2-tert-tetrahydrofuranyl 9-anthracenecarboxylate.

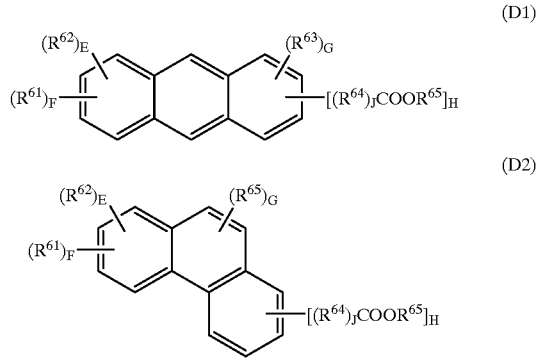

Herein, $R^{61}$ to $R^{63}$ are independently hydrogen or a straight or branched alkyl, straight or branched alkoxy, normal or branched alkoxyalkyl, straight or branched alkenyl or aryl group. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{65}$ is an acid labile group as described above. Letter J is equal to 0 or 1, E, F and G are 0 or integers of 1 to 9, H is a positive integer of 1 to 10, satisfying $E+F+G+H \leq 10$.

An appropriate amount of UV absorber blended is 0 to 10 parts, more preferably 0.5 to 10 parts, most preferably 1 to 5 parts by weight per 100 parts by weight of the base resin.

For the microfabrication of integrated circuits, any well-known lithography may be used to form a resist pattern from the chemical amplification, positive or negative working, resist composition comprising the sulfonyldiazomethane photoacid generator according to the invention.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 mJ/cm$^2$, preferably about 10 to 100 mJ/cm$^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, x-rays, excimer laser light, γ-rays and synchrotron radiation. With any of the above-described parameters outside the above-described range, the process may sometimes fail to produce the desired pattern.

EXAMPLES

Examples of the invention are given below by way of illustration and not by way of limitation.

Synthesis Example 1

Synthesis of bis(4-hydroxyphenylthio)methane

In 500 g of ethanol were dissolved 126 g (1.0 mol) of 4-hydroxythiophenol and 40 g (1.0 mol) of sodium hydroxide. The solution was heated at 60° C. After it was confirmed that sodium hydroxide had been dissolved, 60 g (0.7 mol) of dichloromethane was added dropwise. The solution was heated at 60 to 70° C. in an oil bath, and ripened at the temperature for 3 hours. After cooling, 500 g of water was added to the solution, which was extracted twice with 300 g of dichloromethane. The collected organic layer was concentrated, yielding 140 g of an oily residue. This was used in the subsequent reaction without further purification.

Synthesis Example 2

Synthesis of bis(4-methylsulfonyloxyphenylthio)methane

In 200 g of acetone was dissolved 23 g (0.1 mol) of the bis(4-hydroxyphenylthio)methane crude product in Synthesis Example 1. To this were added 35 g (0.25 mol) of potassium carbonate and 28 g (0.24 mol) of methanesulfonylchloride. While refluxing in an oil bath at 70° C., the solution was ripened for 4 hours. After cooling, the inorganic salt was filtered and washed with 50 g of acetone. The filtrate and wash liquid combined was concentrated, yielding an oily product, which was dissolved in 150 g of dichloromethane. This solution was washed with 100 g of water, and concentrated again. There was yielded 38 g of a concentrated oily residue, which was used in the subsequent reaction without further purification. It is noted that this oily matter crystallized when kept at room temperature.

Synthesis Example 3
Synthesis of bis(4-methylsulfonyloxyphenylsulfonyl)methane The bis(4-methylsulfonyloxyphenylthio)methane crude product in Synthesis Example 2, 38 g (0.097 mol), was dispersed or dissolved in 700 g of ethanol and 50 g of acetic acid. As a catalyst, 3.3 g (0.01 mol) of sodium tungstate dehydrate was added to the solution, which was heated at 60° C. in an oil bath. Then 49 g (0.5 mol) of 35% aqueous hydrogen peroxide was added dropwise at such a rate that the temperature might not exceed 70° C. The solution was ripened for a further 2 hours. Around the end of dropwise addition, crystals precipitated in the reaction system, and more crystals precipitated upon cooling. The crystals were collected by cold filtration and washed with 300 g of water, obtaining 40 g (yield 83%) of the end product.

Synthesis Example 4

Synthesis of bis(4-methylsulfonyloxyphenylsulfonyl)-diazomethane

The bis(4-methylsulfonyloxyphenylsulfonyl)methane in Synthesis Example 3, 9.7 g (0.02 mol), was dispersed in 97 g of dichloromethane. To the dispersion was added 4.6 g (0.03 mol) of p-toluenesulfonylazide which had been separately prepared. With stirring at room temperature, 5.9 g (0.03 mol) of 1,8-diazabicyclo[5.4.0]-7-undecene (DBU) was added to the dispersion, and after 5 minutes, 150 g of a 0.2N aqueous hydrochloric acid was added to stop reaction. The organic layer was separated and washed with 100 g of water. The organic layer was concentrated and 14 g of the residue was purified by silica gel column chromatography using dichloromethane as an elute. The thus obtained oily product was combined with 40 g of hexane for crystallization, followed by filtration and vacuum drying. There was obtained 3.0 g (yield 29%) of fine yellow crystals.

The thus obtained bis(4-methylsulfonyloxyphenylsulfonyl)diazomethane was analyzed by nuclear magnetic resonance (NMR) spectroscopy, infrared (IR) absorption spectroscopy, and elemental analysis, with the results shown below.

$^1$H-NMR: $CDCl_3$;

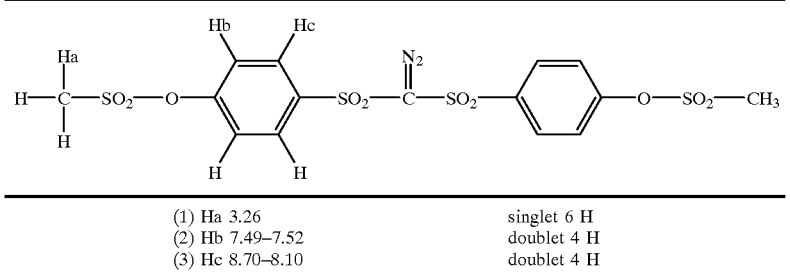

| (1) Ha 3.26 | singlet 6 H |
| (2) Hb 7.49–7.52 | doublet 4 H |
| (3) Hc 8.70–8.10 | doublet 4 H |

IR: $cm^{-1}$;
2117, 1589, 1486, 1407, 1371, 1353, 1205, 1184, 1151, 1083, 977, 875, 852; Elemental analysis for $C_{15}H_{14}N_2O_{10}S_4$: %; Calcd.: C 35.3 H 2.8 N 5.5; Found: C 35.1 H 2.9 N 5.4.

Synthesis Example 5

Synthesis of bis[4-(4'-methylphenylsulfonyloxy)phenylthio]-methane

In 100 g of tetrahydrofuran was dissolved 23 g (0.1 mol) of the bis(4-hydroxyphenylthio)methane crude product in Synthesis Example 1. With 8.8 g (0.22 mol) of sodium hydroxide and 40 g of water added, the solution was cooled in an ice bath. To the solution kept at a temperature below 10° C., 42 g (0.22 mol) of p-toluenesulfonylchloride in solid form was added in divided portions. After the completion of addition, the solution was ripened for one hour. The organic layer was separated, combined with 200 g of dichloromethane, and washed with 100 g of water. The organic layer was concentrated in vacuum, and the residue was purified by silica gel column chromatography. There was obtained 36 g (yield 63%) of the end product.

The thus obtained bis[4-(4'-methylphenylsulfonyloxy) phenylsulfonyl]diazomethane was analyzed by NMR spectroscopy, IR spectroscopy, and elemental analysis, with the results shown below.

$^1$H-NMR: CDCl$_3$;

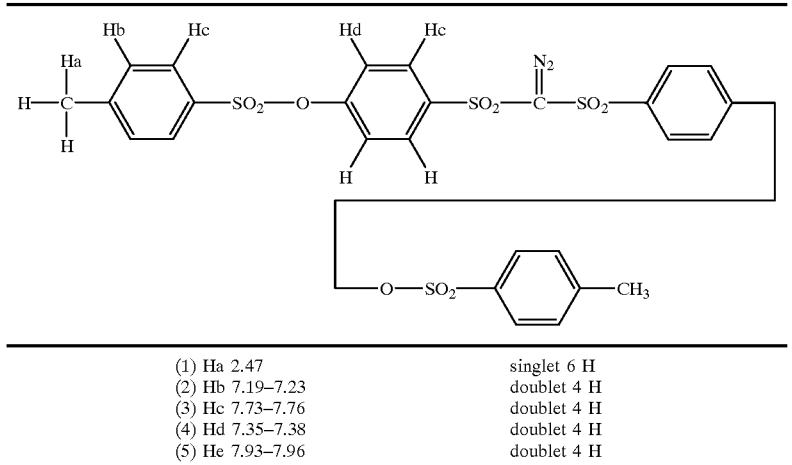

| | | |
|---|---|---|
| (1) Ha 2.47 | | singlet 6 H |
| (2) Hb 7.19–7.23 | | doublet 4 H |
| (3) Hc 7.73–7.76 | | doublet 4 H |
| (4) Hd 7.35–7.38 | | doublet 4 H |
| (5) He 7.93–7.96 | | doublet 4 H |

Synthesis Example 6

Synthesis of bis[4-(4'-methylphenylsulfonyloxy) phenylsulfonyl]methane

The bis[4-(4'-methylphenylsulfonyloxy)phenylthio] methane in Synthesis Example 5, 7.8 g (0.014 mol), and 0.5 g (0.0015 mol) of sodium tungstate dihydrate were dispersed in 120 g of ethanol and 20 g of acetic acid. The dispersion was heated at 60° C. in an oil bath. Then 17 g (0.17 mol) of 35% aqueous hydrogen peroxide was added dropwise at such a rate that the temperature might not exceed 70° C. The solution was ripened at 60° C. for 3 hours. After ripening, the solution was cooled whereupon crystals precipitated. The crystals were collected by filtration and washed with 20 g of water, obtaining 8.2 g (yield 95%) of the end product.

Synthesis Example 7

Synthesis of bis[4-(4'-methylphenylsulfonyloxy) phenylsulfonyl]diazomethane

The bis[4-(4'-methylphenylsulfonyloxy)phenylsulfonyl] methane in Synthesis Example 6, 7.2 g (0.011 mol), was dispersed in 155 g of dichloromethane. To the dispersion was added 2.6 9 (0.017 mol) of p-toluenesulfonylazide which had been separately prepared. With stirring at room temperature, 2.7 g (0.014 mol) of DBU was added to the dispersion, and after 5 minutes, 100 g of a 0.2N aqueous hydrochloric acid was added to stop reaction. The organic layer was separated and washed with 100 g of water. The organic layer was concentrated and 10 g of the residue was purified by silica gel column chromatography using dichloromethane as an elute. The thus obtained oily product was combined with 40 g of hexane for crystallization, followed by filtration and vacuum drying. There was obtained 2.1 g (yield 28%) of fine yellow crystals.

IR: cm$^{-1}$;
2108, 2106, 1586, 1487, 1377, 1375, 1361, 1296, 1203, 1176, 1151, 1091, 1083, 1016, 991, 864; Elemental analysis for C$_{27}$H$_{22}$N$_2$O$_{10}$S$_4$: %; Calcd.: C 48.9 H 3.4 N 4.2; Found: C 48.8 H 3.5 N 4.0.

Synthesis Example 8

Synthesis of bis[4-(n-butylsulfonyloxy) phenylsulfonyl]diazomethane

It was synthesized from the bis(4-hydroxyphenylthio) methane crude product in Synthesis Example 1 as in Synthesis Examples 2, 3 and 4 except that n-butanesulfonylchloride was used instead of methanesulfonylchloride.

Synthesis Example 9

Synthesis of bis[4-(benzenesulfonyloxy) phenylsulfonyl]diazomethane

It was synthesized from the bis(4-hydroxyphenylthio) methane crude product in Synthesis Example 1 as in Synthesis Examples 5, 6 and 7 except that n-butanesulfonylchloride was used instead of methanesulfonylchloride.

Synthesis Example 10

Synthesis of cyclohexylthio(4-hydroxyphenylthio) methane

In 100 g of ethanol were dispersed 12.6 g (0.1 mol) of 4-hydroxythiophenol and 4.0 g (0.1 mol) of sodium hydroxide. The dispersion was heated at 70° C. for dissolution. To the solution, 16.5 g (0.1 mol) of chloromethylcyclohexylsulfide, which was separately prepared from cyclohexanethiol, formaldehyde and hydrochloric acid according to the teaching of U.S. Pat. No. 2,354,230, was added dropwise. The solution was ripened at 70° C. for 4 hours. Thereafter, the solution was cooled, combined with 50 g of water, which was extracted twice with 100 g of dichloromethane. The organic layer was concentrated in vacuum, obtaining 26 g of the crude end product. It was subject to the subsequent reaction without further purification.

Synthesis Example 11

Synthesis of cyclohexylthio(4-methanesulfonyloxyphenylthio)methane

In 300 g of acetone was dissolved 26 g of the cyclohexylthio(4-hydroxyphenylthio)methane crude product in Synthesis Example 10. To this were added 21 g (0.15 mol) of potassium carbonate and 13 g (0.11 mol) of methanesulfonylchloride. While heating in an oil bath at 70° C., the solution was ripened for 4 hours. At the end of ripening, the inorganic salt was filtered and washed with 50 g of acetone. The filtrate and wash liquid combined was concentrated, and the residue was dissolved in 300 g of dichloromethane and washed with 50 g of water. The organic layer was concentrated in vacuum again, obtaining 30 g of an oily product, which was used in the subsequent reaction without further purification.

Synthesis Example 12

Synthesis of cyclohexylsulfonyl(4-methanesulfonyloxyphenylsulfonyl)methane

The cyclohexylthio(4-methanesulfonyloxyphenylthio) methane crude product in Synthesis Example 11, 30 g, was dispersed in 200 g of ethanol and 20 g of acetic acid, to which 3.5 g (0.01 mol) of sodium tungstate dihydrate was added. After the solution was heated at 70° C., 68 g (0.7 mol) of 35% aqueous hydrogen peroxide was added dropwise at such a rate that the temperature might not exceed 75° C. After the completion of addition, the solution was ripened at 70° C. for a further 5 hours. After ripening, the solution was allowed to cool down to room temperature whereupon crystals precipitated. There was obtained 33 g (yield 83%) of the end product.

Synthesis Example 13

Synthesis of cyclohexylsulfonyl(4-methanesulfonyloxyphenylsulfonyl)diazomethane

The cyclohexylsulfonyl(4-methanesulfonyloxyphenylsulfonyl)methane in Synthesis Example 12, 10 g (0.025 mol), was dispersed in 150 g of dichloromethane. To the dispersion was added 4.6 g (0.03 mol) of p-toluenesulfonylazide. With stirring under ice cooling, 4.9 g (0.025 mol) of DBU was added to the dispersion, and after 10 minutes, 100 g of a 0.2N aqueous hydrochloric acid was added to stop reaction. The organic layer was separated and washed with 100 g of water. The organic layer was concentrated and 13 g of the residue was purified by silica gel column chromatography using dichloromethane as an elute. The thus obtained oily product was combined with 20 g of hexane for crystallization, followed by filtration and vacuum drying. There was obtained 4.0 g (yield 38%) of fine yellow crystals.

The thus obtained cyclohexylsulfonyl(4-methanesulfonyloxyphenylsulfonyl)diazomethane was analyzed by NMR spectroscopy, IR spectroscopy, and elemental analysis, with the results shown below.

$^1$H-NMR: CDCl$_3$, ppm;

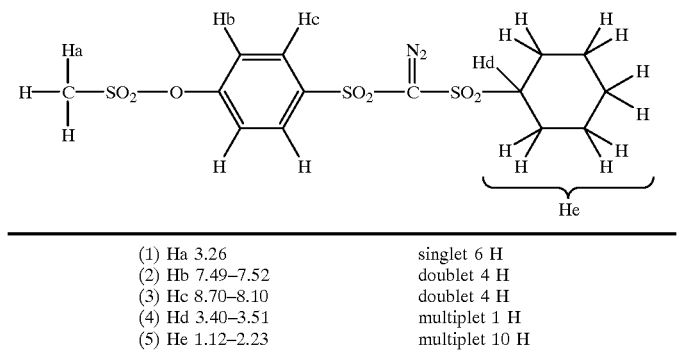

| (1) Ha 3.26 | singlet 6 H |
| (2) Hb 7.49–7.52 | doublet 4 H |
| (3) Hc 8.70–8.10 | doublet 4 H |
| (4) Hd 3.40–3.51 | multiplet 1 H |
| (5) He 1.12–2.23 | multiplet 10 H |

IR: cm$^{-1}$;
2109, 2106, 1585, 1487, 1376, 1375, 1360, 1296, 1203, 1177, 1153, 1091, 1084, 1016, 991, 864; Elemental analysis for $C_{14}H_{18}N_2O_7S_3$: %; Calcd.: C 39.8 H 4.3 N 6.6; Found: C 39.6 H 4.5 N 6.4.

Synthesis Example 14

Synthesis of (4-methanesulfonyloxyphenylsulfonyl) (benzoyl)diazomethane

It was synthesized as in Synthesis Examples 10, 11, 12 and 13 except that a-bromoacetophenone was used instead of chloromethylccylohexylhexylsulfide in Synthesis Example 10 and the amount of oxidant was reduced to one half.

Examples 1–24 and Comparative Examples 1–4

Resist materials were formulated in accordance with the formulation shown in Tables 1 to 3. The components used are shown below.
Polymer A: poly(p-hydroxystyrene) in which hydroxyl groups are protected with 15 mol % of 1-ethoxyethyl groups and 15 mol % of tert-butoxycarbonyl groups, having a weight average molecular weight of 12,000.
Polymer B: poly(p-hydroxystyrene) in which hydroxyl groups are protected with 10 mol % of 1-ethoxyethyl groups and 15 mol % of tert-butoxycarbonyl groups, having a weight average molecular weight of 11,000.

Polymer C: poly(p-hydroxystyrene) in which hydroxyl groups are protected with 15 mol % of 1-ethoxyethyl groups and 10 mol % of tert-butoxycarbonyl groups, having a weight average molecular weight of 11,000.

Polymer D: poly(p-hydroxystyrene) in which hydroxyl groups are protected with 25 mol % of 1-ethoxyethyl groups and crosslinked with 3 mol % of 1,2-propanediol divinyl ether, having a weight average molecular weight of 13,000.

Polymer E: poly(p-hydroxystyrene) in which hydroxyl groups are protected with 30 mol % of 1-ethoxyethyl groups, having a weight average molecular weight of 12,000.

Polymer F: poly(p-hydroxystyrene) in which hydroxyl groups are protected with 10 mol % of 1-ethoxyethyl groups and 10 mol % of tert-butoxycarbonyl groups, and crosslinked with 3 mol % of 1,2-propanediol divinyl ether, having a weight average molecular weight of 15,000.

Polymer G: poly(p-hydroxystyrene) in which hydroxyl groups are protected with 15 mol % of 1-ethoxyethyl groups and 10 mol % of tert-butoxycarbonyl groups, and crosslinked with 3 mol % of 1,2-propanediol divinyl ether, having a weight average molecular weight of 13,000.

Polymer H: p-hydroxystyrene-l-ethylcyclopentyl methacrylate copolymer having a compositional ratio (molar ratio) of 70:30 and a weight average molecular weight of 11,000.

Polymer I: p-hydroxystyrene-1-ethylcyclopentyl acrylate copolymer having a compositional ratio (molar ratio) of 65:35 and a weight average molecular weight of 14,000.

Polymer J: the same as Polymer I, but further containing 5% by weight of styrene and having a weight average molecular weight of 12,000.

Polymer K: p-hydroxystyrene-1-ethylcyclopentyl methacrylate copolymer having a compositional ratio (molar ratio) of 70:30 in which phenolic hydroxyl groups on p-hydroxystyrene are crosslinked with 2 mol % of 1,2-propanediol divinyl ether, and having a weight average molecular weight of 13,000.

Polymer L: p-hydroxystyrene-1-ethylcyclopentyl methacrylate-p-tert-butoxystyrene copolymer having a compositional ratio (molar ratio) of 60:30:10 and a weight average molecular weight of 12,000.

Polymer M: p-hydroxystyrene-1-ethylcyclopentyl methacrylate-p-tert-butoxycarbonyloxystyrene copolymer having a compositional ratio (molar ratio) of 70:20:10 in which phenolic hydroxyl groups on p-hydroxystyrene are crosslinked with 1 mol % of 1,2-propanediol divinyl ether, and having a weight average molecular weight of 12,000.

Polymer N: poly(p-hydroxystyrene) in which hydroxyl groups are protected with 8 mol % of acetyl groups, having a weight average molecular weight of 8,000.

PAG1: bis(4-methylsulfonyloxyphenylsulfonyl)diazomethane (obtained in Synthesis Example 4)

PAG2: bis(4-(n-butylsulfonyloxy)phenylsulfonyl)diazomethane (obtained in Synthesis Example 8)

PAG3: (4-tert-butoxyphenyl)diphenylsulfonium p-toluenesulfonate

PAG4: (4-tert-butoxyphenyl)diphenylsulfonium 10-camphorsulfonate

PAG5: bis(tert-butylsulfonyl)diazomethane

PAG6: bis(cyclohexylsulfonyl)diazomethane

PAG7: bis(4-(1'-ethoxyethoxy)phenylsulfonyl)diazomethane

PAG8: cyclohexylsulfonyl-phenylsulfonyldiazomethane

PAG9: bis(2,4-dimethylphenylsulfonyl)diazomethane

Crosslinker A: 1,3,5,7-tetramethoxymethylglycoluril

Dissolution inhibitor A: bis(4-(2'-tetrahydropyranyloxy)phenyl)methane

Basic compound A: tri-n-butylamine

Basic compound B: tris(2-methoxyethyl)amine Organic acid derivative A: 4,4-bis(4'-hydroxyphenyl)valeric acid Organic acid derivative B: salicylic acid Surfactant A: FC-430 (Sumitomo 3M K.K.) Surfactant B: Surflon S-381 (Asahi Glass K.K.) UV absorber A: 9,10-dimethylanthracene Solvent A: propylene glycol methyl ether acetate Solvent B: ethyl lactate The resist materials thus obtained were each filtered through a 0.2-$\mu$m Teflon filter, thereby giving resist solutions. These resist solutions were spin-coated onto silicon wafers, then baked at 100° C. for 90 seconds on a hot plate to give resist films having a thickness of 0.6 $\mu$m. The resist films were exposed using an excimer laser stepper NSR2005EX (Nikon K.K., NA 0.5), then baked (PEB) at 110° C. for 90 seconds, and developed with a solution of 2.38% tetramethylammonium hydroxide in water, thereby giving positive patterns (Examples 1 to 23 and Comparative Examples 1–4) or negative patterns (Example 24).

The resulting resist patterns were evaluated as described below.

Resist Pattern Evaluation

Provided that the exposure dose which provides a 1:1 resolution at the top and bottom of a 0.24-$\mu$m line-and-space pattern was the optimum exposure dose (sensitivity Eop), the minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PED) after 24 hours of holding from exposure at the optimum dose and determining a variation in line width (or groove width for the negative resist). The less the variation, the greater is the PED stability.

The results of resist pattern evaluation are shown in Table 4.

Other Evaluation

The solubility of resist material in a solvent mixture was examined by visual observation and in terms of clogging upon filtration.

With respect to the applicability of a resist solution, uneven coating was visually observed. Additionally, using a film gage Clean Track Mark 8 (Tokyo Electron K.K.), the thickness of a resist film on a common wafer was measured at different positions, based on which a variation from the desired coating thickness (0.6 $\mu$m) was calculated. The applicability was rated "good" when the variation was within 0.5% (that is, within 0.003 $\mu$m), "unacceptable" when the variation was within 1%, and "poor" when the variation was more than 1%.

Storage stability was judged in terms of foreign matter precipitation or sensitivity change during aging. After the resist solution was aged for 100 days at the longest, the number of particles of greater than 0.3 $\mu$m per ml of the resist solution was counted by means of a particle counter KL-20A (Rion K.K.), and the foreign matter precipitation was determined "good" when the number of particles is not more than 5. Also, the sensitivity change was rated "good" when a change with time of sensitivity (Eop) was within 5% from that immediately after preparation, and "poor" when the change is more than 5%.

Debris appearing on the developed pattern was observed under a scanning electron microscope (TDSEM) model S-7280H (Hitachi K.K.). The resist film was rated "good" when the number of foreign particles was up to 10 per 100 $\mu$m$^2$, "unacceptable" when from 11 to 15, and "poor" when more than 15.

Debris left after resist peeling was examined using a surface scanner Surf-Scan 6220 (Tencol Instruments). A resist-coated 8-inch wafer was subjected to entire exposure rather than patterned exposure, processed in a conventional manner, and developed with a 2.38% TMAH solution before the resist film was peeled off (only the resist film in the exposed area was peeled). After the resist film was peeled, the wafer was examined and rated "good" when the number of foreign particles of greater than 0.20 μm was up to 100, "unacceptable" when from 101 to 150, and "poor" when more than 150.

The results are shown in Table 5.

TABLE 1

| Composition (pbw) | E1 | E2 | E3 | E4 | E5 | E6 | E7 | E8 | E9 | E10 | E11 | E12 |
|---|---|---|---|---|---|---|---|---|---|---|---|---|
| Polymer A | 80 | | | | | | | | | | | |
| Polymer B | | 80 | | | | | | | | | | |
| Polymer C | | | 80 | | | | | | | | | |
| Polymer D | | | | 80 | | | | | | | | |
| Polymer E | | | | | 80 | | | | | | | |
| Polymer F | | | | | | 80 | | | | | | |
| Polymer G | | | | | | | 80 | | | | | |
| Polymer H | | | | | | | | 80 | | | | |
| Polymer I | | | | | | | | | 80 | | | |
| Polymer J | | | | | | | | | | 80 | | |
| Polymer K | | | | | | | | | | | 80 | |
| Polymer L | | | | | | | | | | | | 80 |
| Polymer M | | | | | | | | | | | | |
| Polymer N | | | | | | | | | | | | |
| PAG1 | 2 | | 2 | 2 | 2 | 2 | 2 | | 2 | | 2 | |
| PAG2 | | 2 | | | | | | 2 | | 2 | | 2 |
| PAG3 | | | | | | | | | | | | |
| PAG4 | 1 | 1 | 1 | 1 | 1 | 1 | 1 | 1 | | | | |
| PAG5 | | | | | | | | | 1 | 1 | 1 | 1 |
| PAG6 | | | | | | | | | | | | |
| Crosslinker A | | | | | | | | | | | | |
| Dissolution inhibitor A | | | | | | | | | | | | |
| Basic compound A | 0.125 | 0.125 | 0.125 | 0.125 | 0.125 | 0.125 | 0.125 | 0.125 | 0.125 | 0.125 | 0.125 | 0.125 |
| Basic compound B | | | | | | | | | | | | |
| Organic acid derivative A | 1 | 1 | 1 | 1 | 1 | 1 | 1 | 1 | 1 | 1 | 1 | 1 |
| Organic acid derivative B | | | | | | | | | | | | |
| Surfactant A | 0.25 | 0.25 | 0.25 | 0.25 | 0.25 | 0.25 | 0.25 | 0.25 | 0.25 | 0.25 | 0.25 | 0.25 |
| Surfactant B | | | | | | | | | | | | |
| UV absorber A | | | | | | | | | | | | |
| Solvent A | 280 | 280 | 280 | 280 | 280 | 280 | 280 | 280 | 280 | 280 | 280 | 280 |
| Solvent B | 105 | 105 | 105 | 105 | 105 | 105 | 105 | 105 | 105 | 105 | 105 | 105 |

TABLE 2

| Composition (pbw) | E13 | E14 | E15 | E16 | E17 | E18 | E19 | E20 | E21 | E22 | E23 | E24 |
|---|---|---|---|---|---|---|---|---|---|---|---|---|
| Polymer A | 40 | 40 | 40 | 50 | 50 | 50 | | | | | | |
| Polymer B | | | | | | | | | | | | |
| Polymer C | | | | | | | | | | | | |
| Polymer D | | | | | | | | | | | | |
| Polymer E | | | | | | | | | | | | |
| Polymer F | 40 | | | 20 | 20 | 10 | 40 | 40 | 50 | | | |
| Polymer G | | | | | | | | | | | | |
| Polymer H | | 40 | | 10 | | 10 | 40 | | 20 | 40 | | |
| Polymer I | | | | | | | | | | | | |
| Polymer J | | | 40 | | 10 | 10 | | 40 | 10 | 40 | | |
| Polymer K | | | | | | | | | | | | |
| Polymer L | | | | | | | | | | | | |
| Polymer M | | | | | | | | | | | 80 | |
| Polymer N | | | | | | | | | | | | 80 |
| PAG1 | 2 | | 2 | 1 | | 1 | 2 | 2 | | 2 | 2 | 2 |
| PAG2 | | 2 | | | 1 | | | | 2 | | | |
| PAG3 | | | | 1 | | | | 1 | | | | 1 |
| PAG4 | | | | | 1 | 1 | 1 | | 1 | 2 | 1 | |
| PAG5 | | | 1 | | 1 | | | | 1 | | | |
| PAG6 | 1 | 1 | | 1 | | 1 | 1 | | | | | |
| Crosslinker A | | | | | | | | | | | | 10 |
| Dissolution inhibitor A | | | | 2 | 2 | | | | | | | |

TABLE 2-continued

| Composition (pbw) | E13 | E14 | E15 | E16 | E17 | E18 | E19 | E20 | E21 | E22 | E23 | E24 |
|---|---|---|---|---|---|---|---|---|---|---|---|---|
| Basic compound A | 0.125 | 0.125 | 0.125 | | | 0.075 | 0.125 | 0.125 | | | 0.125 | 0.125 |
| Basic compound B | | | | 0.125 | 0.125 | 0.05 | | | 0.125 | | | 0.125 |
| Organic acid derivative A | 1 | 1 | 1 | | | 0.5 | | 1 | | | 1 | |
| Organic acid derivative B | | | | 1 | 1 | 0.5 | 1 | | 1 | | | |
| Surfactant A | 0.25 | 0.25 | 0.25 | | | 0.125 | 0.25 | 0.25 | | 0.25 | 0.25 | 0.125 |
| Surfactant B | | | | 0.25 | 0.25 | 0.125 | | | 0.25 | | | 0.125 |
| UV absorber A | | | | | | 1 | | | | | | |
| Solvent A | 280 | 280 | 280 | 388 | 388 | 388 | 280 | 280 | 388 | 388 | 280 | 280 |
| Solvent B | 105 | 105 | 105 | | | | 105 | 105 | | | 105 | 105 |

TABLE 3

| Composition (pbw) | CE1 | CE2 | CE3 | CE4 |
|---|---|---|---|---|
| Polymer A | 80 | 80 | | |
| Polymer F | | | 80 | |
| Polymer H | | | | 80 |
| PAG3 | | | | 2 |
| PAG7 | 2 | | | |
| PAG8 | | 4 | | |
| PAG9 | | | 2 | |
| Organic acid derivative A | | | | |
| Organic acid derivative B | 1 | | | |
| Basic compound A | 0.125 | | 0.125 | |
| Basic compound B | | 0.125 | | 0.125 |
| Surfactant A | 0.25 | | 0.25 | |
| Surfactant B | | 0.25 | | 0.25 |
| Solvent A | 388 | 388 | 388 | 388 |

TABLE 4

| | Sensitivity (mJ/cm$^2$) | Resolution ($\mu$m) | Profile | 24 hr PED dimensional stability |
|---|---|---|---|---|
| E1 | 26 | 0.19 | rectangular | −12 |
| E2 | 28 | 0.21 | rectangular | −9 |
| E3 | 25 | 0.18 | rectangular | −15 |
| E4 | 23 | 0.17 | rectangular | −20 |
| E5 | 22 | 0.17 | rectangular | −25 |
| E6 | 25 | 0.20 | rectangular | −14 |
| E7 | 25 | 0.18 | rectangular | −17 |
| E8 | 26 | 0.19 | rectangular | 20 |
| E9 | 26 | 0.18 | rectangular | 18 |
| E10 | 29 | 0.20 | rectangular | 10 |
| E11 | 28 | 0.19 | rectangular | 15 |
| E12 | 30 | 0.20 | rectangular | 15 |
| E13 | 26 | 0.19 | rectangular | −16 |
| E14 | 26 | 0.19 | rectangular | 12 |
| E15 | 27 | 0.20 | rectangular | 10 |
| E16 | 27 | 0.19 | rectangular | −15 |
| E17 | 27 | 0.20 | rectangular | −15 |
| E18 | 28 | 0.20 | rectangular | −10 |
| E19 | 24 | 0.21 | rectangular | 12 |
| E20 | 25 | 0.21 | rectangular | 9 |
| E21 | 24 | 0.20 | rectangular | −8 |
| E22 | 27 | 0.19 | rectangular | 15 |
| E23 | 28 | 0.19 | rectangular | 13 |
| E24 | 28 | 0.25 | rectangular (negative) | −5 |
| CE1 | 30 | 0.22 | forward tapered | −30 |
| CE2 | 27 | 0.22 | rounded head | −30 |
| CE3 | 31 | 0.23 | forward tapered | −30 |
| CE4 | 29 | 0.23 | forward tapered | 40 |

TABLE 5

| | Dissolution | Application | 100 day storage stability | Debris after development (patterning) | Debris after peeling |
|---|---|---|---|---|---|
| E1 | good | good | good | good | good |
| E2 | good | good | good | good | good |
| E3 | good | good | good | good | good |
| E4 | good | good | good | good | good |
| E5 | good | good | good | good | good |
| E6 | good | good | good | good | good |
| E7 | good | good | good | good | good |
| E8 | good | good | good | good | good |
| E9 | good | good | good | good | good |
| E10 | good | good | good | good | good |
| E11 | good | good | good | good | good |
| E12 | good | good | good | good | good |
| E13 | good | good | good | good | good |
| E14 | good | good | good | good | good |
| E15 | good | good | good | good | good |
| E16 | good | good | good | good | good |
| E17 | good | good | good | good | good |
| E18 | good | good | good | good | good |
| E19 | good | good | good | good | good |
| E20 | good | good | good | good | good |
| E21 | good | good | good | good | good |
| E22 | good | good | good | good | good |
| E23 | good | good | good | good | good |
| E24 | good | good | good | good | good |
| CE1 | good | unacceptable | <30 days (sensitivity changed) | unacceptable | poor |
| CE2 | good | unacceptable | <30 days (sensitivity changed) | unacceptable | poor |
| CE3 | good | good | <30 days (sensitivity changed) | poor | unacceptable |
| CE4 | unacceptable | unacceptable | good | unacceptable | unacceptable |

There have been described chemical amplification type resist compositions comprising a specific sulfonyldiazomethane having sulfonate groups within its molecule as the photoacid generator. The compositions have many advantages including improved resolution, improved focus latitude, minimized line width variation or shape degradation even on long-term PED, minimized debris left after coating, development and peeling, and improved pattern profile after development. Because of high resolution, the compositions are suited for microfabrication, especially by deep UV lithography.

Japanese Patent Application No. 11-230143 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising as a photoacid generator a sulfonyldiazomethane compound of the following general formula (1):

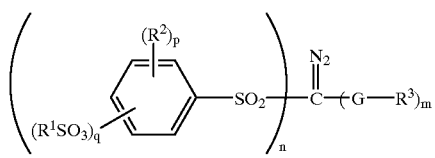

wherein $R^1$ is a substituted or unsubstituted, straight, branched or cyclic alkyl group of 1 to 10 carbon atoms or substituted or unsubstituted aryl group of 6 to 14 carbon atoms, $R^2$ which may be the same or different is a straight, branched or cyclic alkyl group of 1 to 6 carbon atoms, G is $SO_2$ or CO, $R^3$ is a substituted or unsubstituted, straight, branched or cyclic alkyl group of 1 to 10 carbon atoms or substituted or unsubstituted aryl group of 6 to 14 carbon atoms, p is an integer of 0 to 4, q is an integer of 1 to 5, p+q is from 1 to 5, n is equal to 1 or 2, m is equal to 0 or 1, and n+m is equal to 2.

2. A resist composition comprising as a photoacid generator a bissulfonyldiazomethane compound of the following general formula (1a):

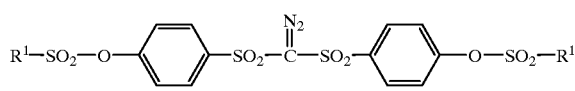

wherein $R^1$ is a substituted or unsubstituted, straight, branched or cyclic alkyl group of 1 to 10 carbon atoms or substituted or unsubstituted aryl group of 6 to 14 carbon atoms.

3. A chemical amplification resist composition comprising (A) a resin which changes its solubility in an alkaline developer under the action of an acid, and (B) a sulfonyldiazomethane compound capable of generating an acid upon exposure to radiation represented by the general formula (1) or (1a) defined in claim 1.

4. The resist composition of claim 3 further comprising (C) a compound capable of generating an acid upon exposure to radiation other than component (B).

5. The resist composition of claim 3 wherein the resin (A) has such substituent groups having C—O—C linkages that the solubility in an alkaline developer changes as a result of scission of the C—O—C linkages under the action of an acid.

6. The resist composition of claim 5 wherein the resin (A) is a polymer containing phenolic hydroxyl groups in which hydrogen atoms of the phenolic hydroxyl groups are replaced by acid labile groups of at least one type in a proportion of more than 0 mol % to 80 mol %, on the average, of the entire hydrogen atoms of the phenolic hydroxyl groups, said polymer having a weight average molecular weight of 3,000 to 100,000.

7. The resist composition of claim 6 wherein the resin (A) is a polymer comprising recurring units represented by the following general formula (2):

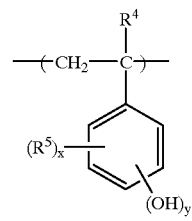

wherein $R^4$ is hydrogen or methyl, $R^5$ is a straight, branched or cyclic alkyl group of 1 to 8 carbon atoms, x is 0 or a positive integer, y is a positive integer, and x+y is up to 5, in which hydrogen atoms of the phenolic hydroxyl groups are replaced by acid labile groups of at least one type in a proportion of more than 0 mol % to 80 mol %, on the average, of the entire hydrogen atoms of the phenolic hydroxyl groups, said polymer having a weight average molecular weight of 3,000 to 100,000.

8. The resist composition of claim 7 wherein the resin (A) is the polymer of formula (2) in which some of the hydrogen atoms of the phenolic hydroxyl groups are replaced by acid labile groups of at least one type, and the hydrogen atoms of the remaining phenolic hydroxyl groups are crosslinked within a molecule and/or between molecules, in a proportion of more than 0 mol % to 50 mol %, on the average, of the entire phenolic hydroxyl groups on the polymer, with crosslinking groups having C—O—C linkages represented by the following general formula (3a) or (3b):

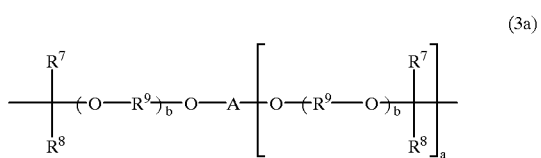

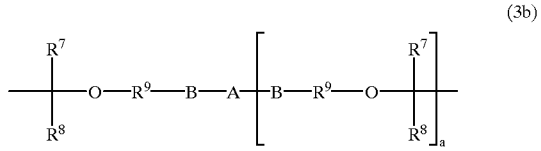

wherein each of $R^7$ and $R^8$ is hydrogen or a straight, branched or cyclic alkyl group of 1 to 8 carbon atoms, or $R^7$ and $R^8$, taken together, may form a ring, and each of $R^7$ and $R^8$ is a straight or branched alkylene group of 1 to 8 carbon atoms when they form a ring, $R^9$ is a straight, branched or cyclic alkylene group of 1 to 10 carbon atoms, letter a is an integer of 1 to 7, letter b is 0 or an integer of 1 to 10, A is an (a+1)-valent aliphatic or alicyclic saturated hydrocarbon group, aromatic hydrocarbon group or heterocyclic group of 1 to 50 carbon atoms, which may be separated by a hetero atom and in which some of the hydrogen atoms attached to carbon atoms may be replaced by hydroxyl, carboxyl, carbonyl or halogen, B is —CO—O—, —NHCO—O— or —NHCONH—.

9. The resist composition of claim 5 wherein the resin (A) is a polymer comprising recurring units represented by the following general formula (2'):

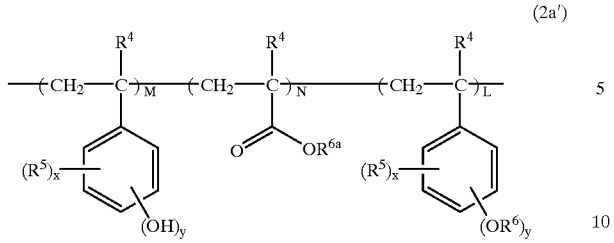

(2a')

wherein $R^4$ is hydrogen or methyl, $R^5$ is a straight, branched or cyclic alkyl group of 1 to 8 carbon atoms, $R^6$ is an acid labile group, $R^{6a}$ is hydrogen or an acid labile group, $R^{6a}$ being at least partially an acid labile group, x is 0 or a positive integer, y is a positive integer, satisfying $x+y\leq 5$, M and N are positive integers, L is 0 or a positive integer, satisfying $0<N/(M+N)\leq 0.5$ and $0<(N+L)/(M+N+L) \leq 0.8$, that is, a copolymer comprising units of p-hydroxystyrene and/or α-methyl-p-hydroxystyrene, units thereof in which some hydrogen atoms of phenolic hydroxyl groups are replaced by acid labile groups of at least one type, and units of acrylate and/or methacrylate, wherein the acrylate and/or methacrylate is an ester protected with an acid labile group, the units of acrylate and methacrylate are contained in the polymer in a proportion of more than 0 mol % to 50 mol % on the average, the acid labile groups are present in a proportion of more than 0 mol % to 80 mol %, on the average, based on the entire polymer, and the polymer has a weight average molecular weight of 3,000 to 100,000.

10. The resist composition of claim 6 wherein said acid labile groups are groups of the following general formulae (4) to (7), tertiary alkyl groups of 4 to 20 carbon atoms, trialkylsilyl groups whose alkyl groups each have 1 to 6 carbon atoms, oxoalkyl groups of 4 to 20 carbon atoms, or aryl-substituted alkyl groups of 7 to 20 carbon atoms,

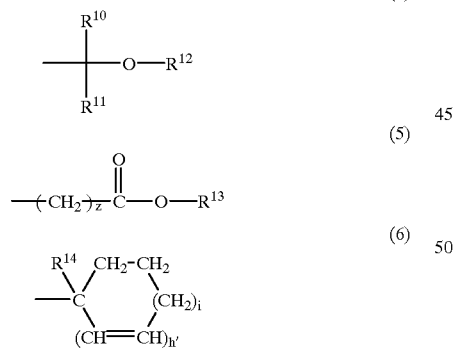

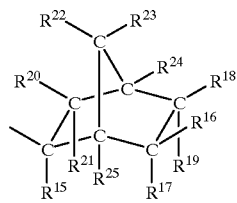

wherein $R^{10}$ and $R^{11}$ are independently hydrogen or straight, branched or cyclic alkyl groups of 1 to 18 carbon atoms, $R^{12}$ is a monovalent hydrocarbon group of 1 to 18 carbon atoms which may have a hetero atom, or $R^{10}$ and $R^{11}$, $R^{10}$ and $R^{12}$, or $R^{11}$ and $R^{12}$, taken together, may form a ring, with the proviso that each of $R^{10}$, $R^{11}$ and $R^{12}$ is a straight or branched alkylene group of 1 to 18 carbon atoms when they form a ring, $R^{13}$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (4), and letter z is an integer of 0 to 6, $R^{14}$ is a straight, branched or cyclic alkyl group of 1 to 8 carbon atoms or substituted or unsubstituted aryl group of 6 to 20 carbon atoms, h' is equal to 0 or 1, i is equal to 0, 1, 2 or 3, satisfying 2h'+i=2 or 3, $R^{15}$ is a straight, branched or cyclic alkyl group of 1 to 8 carbon atoms or substituted or unsubstituted aryl group of 6 to 20 carbon atoms, $R^{16}$ to $R^{25}$ are independently hydrogen or monovalent hydrocarbon groups of 1 to 15 carbon atoms which may contain a hetero atom, or $R^{16}$ to $R^{25}$, taken together, may form a ring, with the proviso that they are divalent hydrocarbon groups of 1 to 15 carbon atoms which may contain a hetero atom when they form a ring, or two of $R^{16}$ to $R^{25}$ which are attached to adjacent carbon atoms may directly bond together to form a double bond.

11. The resist composition of claim 3 further comprising (D) a basic compound.

12. The resist composition of claim 3 further comprising (E) an organic acid derivative.

13. The resist composition of claim 3 further comprising a propylene glycol alkyl ether acetate, an alkyl lactate or a mixture thereof as a solvent.

14. A process for forming a pattern, comprising the steps of:

applying the resist composition of claim 1 onto a substrate to form a coating, heat treating the coating and exposing the coating to high energy radiation with a wavelength of up to 300 nm or electron beam through a photo-mask, optionally heat treating the exposed coating, and developing the coating with a developer.

* * * * *